(12) United States Patent
Adusumilli et al.

(10) Patent No.: US 12,281,996 B2
(45) Date of Patent: Apr. 22, 2025

(54) SEMICONDUCTOR STRUCTURE INCLUDING PHOTODIODE-BASED FLUID SENSOR AND METHODS

(71) Applicant: GlobalFoundries U.S. Inc., Malta, NY (US)

(72) Inventors: Siva P. Adusumilli, South Burlington, VT (US); Mark D. Levy, Williston, VT (US); Ramsey M. Hazbun, Colchester, VT (US); John J. Ellis-Monaghan, Grand Isle, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 521 days.

(21) Appl. No.: 17/808,176

(22) Filed: Jun. 22, 2022

(65) Prior Publication Data
US 2023/0417695 A1   Dec. 28, 2023

(51) Int. Cl.
*G01N 27/06* (2006.01)
*H10F 30/223* (2025.01)
*H10F 71/00* (2025.01)
*H10F 77/14* (2025.01)

(52) U.S. Cl.
CPC ............ *G01N 27/06* (2013.01); *H10F 30/223* (2025.01); *H10F 71/121* (2025.01); *H10F 77/143* (2025.01)

(58) Field of Classification Search
CPC ...... G01N 27/06; G01N 27/00; G01N 27/414; H10F 30/223; H10F 71/121;
(Continued)

(56) References Cited

U.S. PATENT DOCUMENTS 7,452,713 B2   11/2008   Barlocchi et al.
7,923,194 B2   4/2011    Kohl et al.
(Continued)

OTHER PUBLICATIONS

Jeon et al., "Buried Air Gap Structure for Improving the Breakdown Voltage of SOI Power MOSFET's, " IEEE, 2002, pp. 1061-1063.
(Continued)

*Primary Examiner* — David Z Huang
(74) *Attorney, Agent, or Firm* — Francois Pagette; Hoffman Warnick LLC

(57) ABSTRACT

Disclosed is a semiconductor structure with a photodiode including: a well region with a first-type conductivity in a substrate, a trench in the well region, and multiple conformal semiconductor layers in the trench. The semiconductor layers include a first semiconductor layer, which is, for example, an intrinsic semiconductor layer and lines the trench, and a second semiconductor layer, which has a second-type conductivity and which is on the first semiconductor layer within (but not filling) the trench and which also extends outside the trench onto a dielectric layer. An additional dielectric layer extends over and caps a cavity that is at least partially within the trench such that surfaces of the second semiconductor layer are exposed within the cavity. Fluid inlet/outlet ports extend to the cavity and contacts extend to the well region and to the second semiconductor layer. Also disclosed are methods for forming and using the semiconductor structure.

20 Claims, 21 Drawing Sheets

(58) Field of Classification Search
CPC ....... H10F 77/143; H10F 77/484; H10D 1/00; H10D 44/462; H10D 64/514
See application file for complete search history.

(56) References Cited

U.S. PATENT DOCUMENTS

| | | | |
|---|---|---|---|
| 8,841,156 | B2 | 9/2014 | Burchard |
| 9,119,533 | B2 * | 9/2015 | Ghaffari ................ A61B 5/683 |
| 9,945,807 | B2 | 4/2018 | Baghbani-Parizi et al. |
| 9,976,982 | B2 * | 5/2018 | Cheng ................ G01N 27/4148 |
| 10,168,478 | B2 | 1/2019 | Babakhani et al. |
| 10,658,410 | B2 * | 5/2020 | Cheng ................... H10F 39/018 |
| 2007/0057355 | A1 | 3/2007 | Barlocchi et al. |

OTHER PUBLICATIONS

Dong et al., "Two-micron-wavelength germanium-tin photodiodes with low dark current and gigahertz bandwidth," vol. 25, No. 14, Jul. 10, 2017, Optics Express, pp. 15818-15827.

Escorihuela et al., "Chemical silicon surface modification and bioreceptor attachment to develop competitive integrated photonic biosensors", Analytical and Bioanalytical Chemistry, Aug. 2012, 11 pages.

Yan et al., "A Miniaturized Colorimeter with a Novel Design and High Precision for Photometric Detection", Sensors, 2018, 14 pages.

Kettlitz et al., "Flexible planar microfluidic chip employing a light emitting diode and a PIN-photodiode for portable flow cytometers", Lab on a Chip, 2012.

Ohkubo et al., "Preliminary scanning fluorescence detection of a minute particle running along a waveguide implemented microfluidic channel using a light switching mechanism", Microsystems Technologies 22, 1227-1240 (2016).

Pinto et al., "Optical biosensing in microfluidics using nanoporous microbeads and amorphous silicon thin-film photodiodes: quantitative analysis of molecular recognition and signal transduction", J. Micromechanics and Miroengineering, 2018.

* cited by examiner

OPERATING METHOD

SEMICONDUCTOR STRUCTURE INCLUDING PHOTODIODE-BASED FLUID SENSOR AND METHODS

BACKGROUND

Field of the Invention

The present invention relates to fluid sensors and, more particularly to embodiments of a semiconductor structure including a fluid-sensing photodiode and to embodiments of methods of forming and operating the fluid-sensing photodiode.

Description of Related Art

Lab-on-chip (LOC) structures typically include fluid sensors, such as field effect transistor (FET)-based sensors with fluid-containing gate structures (e.g., biosensor FETs (bioFETs), ion-sensitive FETs (ISFETs), or the like). Such fluid sensors can be employed, for example, to detect a target (e.g., an analyte, component, or chemical species) in a fluid and, optionally, to characterize the target (e.g., measure the concentration of the target in the fluid). There is, however, a need in the art for sensors, such as biosensors, with improved sensitivity.

SUMMARY

Disclosed herein are embodiments of a structure. The structure can include a first dielectric layer on a semiconductor substrate. The structure can further include a well region in the semiconductor substrate adjacent to the first dielectric layer. This well region can have a first-type conductivity. The structure can further include a trench that extends through the first dielectric layer into the well region and semiconductor layers lining the trench. Specifically, the semiconductor layers can include a first semiconductor layer within the trench. The semiconductor layers can also include a second semiconductor layer, which has a second-type conductivity that is different from the first-type conductivity of the well region, which has a first portion on the first semiconductor layer within the trench, and which has a second portion that extends laterally out of the trench onto the top surface of the first dielectric layer. As illustrated, the first portion of the second semiconductor layer does not fill the trench. Instead the structure includes a cavity (also referred to herein as a fluid reservoir) at least partially within the trench such that surfaces of the first portion of the second semiconductor layer are exposed within this cavity. The structure can further include a second dielectric layer, which is on the first dielectric layer and which extends over the trench and, more particularly, over the cavity.

Also disclosed herein are embodiments of a method of forming the above-described structure. The method can include providing a semiconductor substrate. The method can further include forming a semiconductor structure, as described above, using the semiconductor substrate. Specifically, the semiconductor structure can be formed so that it includes a first dielectric layer on the semiconductor substrate and a well region, which is in the semiconductor substrate adjacent to the first dielectric layer and which has a first-type conductivity. The structure can further be formed so that it includes a trench that extends through the first dielectric layer into the well region and multiple semiconductor layers that line the trench. The semiconductor layers can include a first semiconductor layer within the trench and a second semiconductor layer, which has a second-type conductivity that is different from the first-type conductivity of the well region, which has a first portion on the first semiconductor layer within the trench, and which has a second portion that extends laterally out of the trench onto the top surface of the first dielectric layer. The structure can further be formed so that it includes second dielectric layer, which is on the first dielectric layer and which extends over the trench and, more particularly, over a cavity (also referred to herein as a fluid reservoir) at least partially within the trench such that surfaces of the first portion of the second semiconductor layer are exposed within this cavity.

In some exemplary structure and method embodiments, the well region, the first semiconductor layer, and the second semiconductor layer can form a PIN diode, such as a PIN photodiode, suitable for use as a photodiode-based fluid sensor. Thus, also disclosed herein are embodiments of a method of operating the above-described structure as a photodiode-based fluid sensor. The method can include providing a semiconductor structure, as described above, where the well region, the first semiconductor layer and the second semiconductor layer form a PIN photodiode and where surfaces of the second semiconductor layer are exposed within a cavity. The method can further include causing a fluid to flow into the cavity and contact exposed surfaces of the first portion of the second semiconductor layer within the cavity. The method can further include causing the photodiode to be illuminated. The processes of causing of the fluid to flow into the cavity and causing of the photodiode to be illuminated can be performed concurrently. The method can further include sensing an output current of the photodiode in response to the concurrent illumination of the photodiode and fluid flow into the cavity.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, LOC structures typically include fluid sensors, such as FET-based sensors with fluid-containing gate structures (e.g., bioFETs, ISFETs, or the like). Such fluid sensors can be employed, for example, to detect a target (e.g., an analyte, component, or chemical species) in a fluid and, optionally, to characterize the target (e.g., measure the concentration of the target in the fluid). There is, however, a need in the art for sensors, such as biosensors, with improved sensitivity.

In view of the foregoing, disclosed herein are embodiments of a semiconductor structure (e.g., a LOC structure) that includes a photodiode-based fluid sensor (e.g., a photodiode-based biosensor) with improved sensitivity. Specifically, the disclosed semiconductor structure can include a photodiode (e.g., a PIN photodiode). The photodiode can include a well region with a first-type conductivity (e.g., an N+ well) in a semiconductor substrate, a trench in the well region, and multiple conformal semiconductor layers in the trench. These semiconductor layers can include a first semiconductor layer, which is, for example, an intrinsic semiconductor layer and which lines the trench, and a second semiconductor layer, which has a second-type conductivity (e.g., a P+ semiconductor layer) and which is on the first semiconductor layer within (but not filling) the trench and which further extends outside the trench onto a dielectric layer. An additional dielectric layer can extend over and cap a cavity (also referred to herein as a fluid reservoir) that is at least partially within the trench such that surfaces of the second semiconductor layer are exposed within the cavity. One or more fluid inlet/outlet ports can extend through the additional dielectric layer to the cavity. Additionally, contacts can extend to the well region on one side of the trench and to the second semiconductor layer on the opposite side of the trench. Also disclosed herein are method embodiments for forming and for using the semiconductor structure.

Figure 1A:
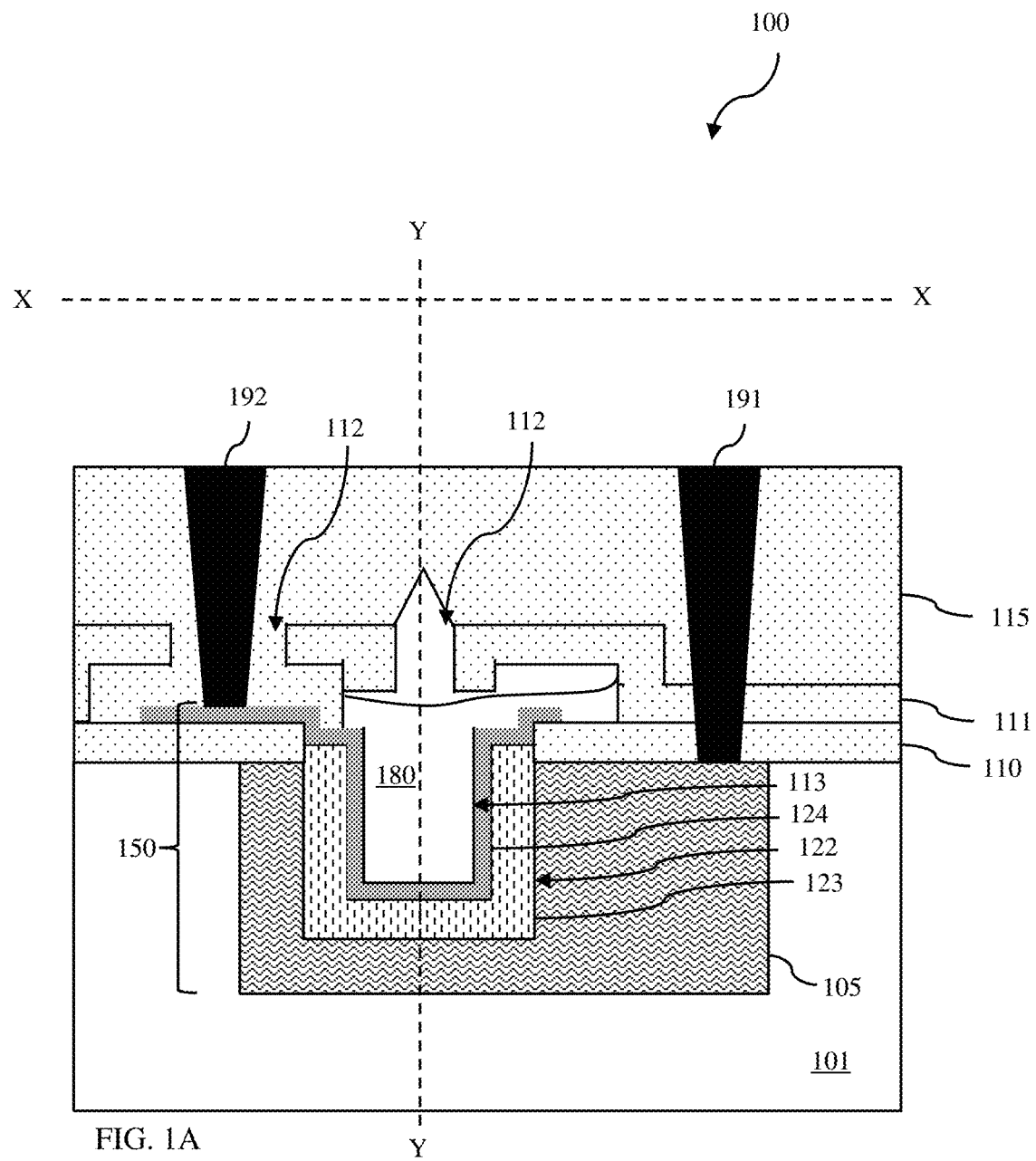
FIGS. 1A and 1B are different cross-section diagrams of an embodiment of a semiconductor structure that includes a photodiode-based fluid sensor and FIG. 1C is a layout diagram of the semiconductor structure shown in FIGS. 1A and 1B.
Figure 1B:
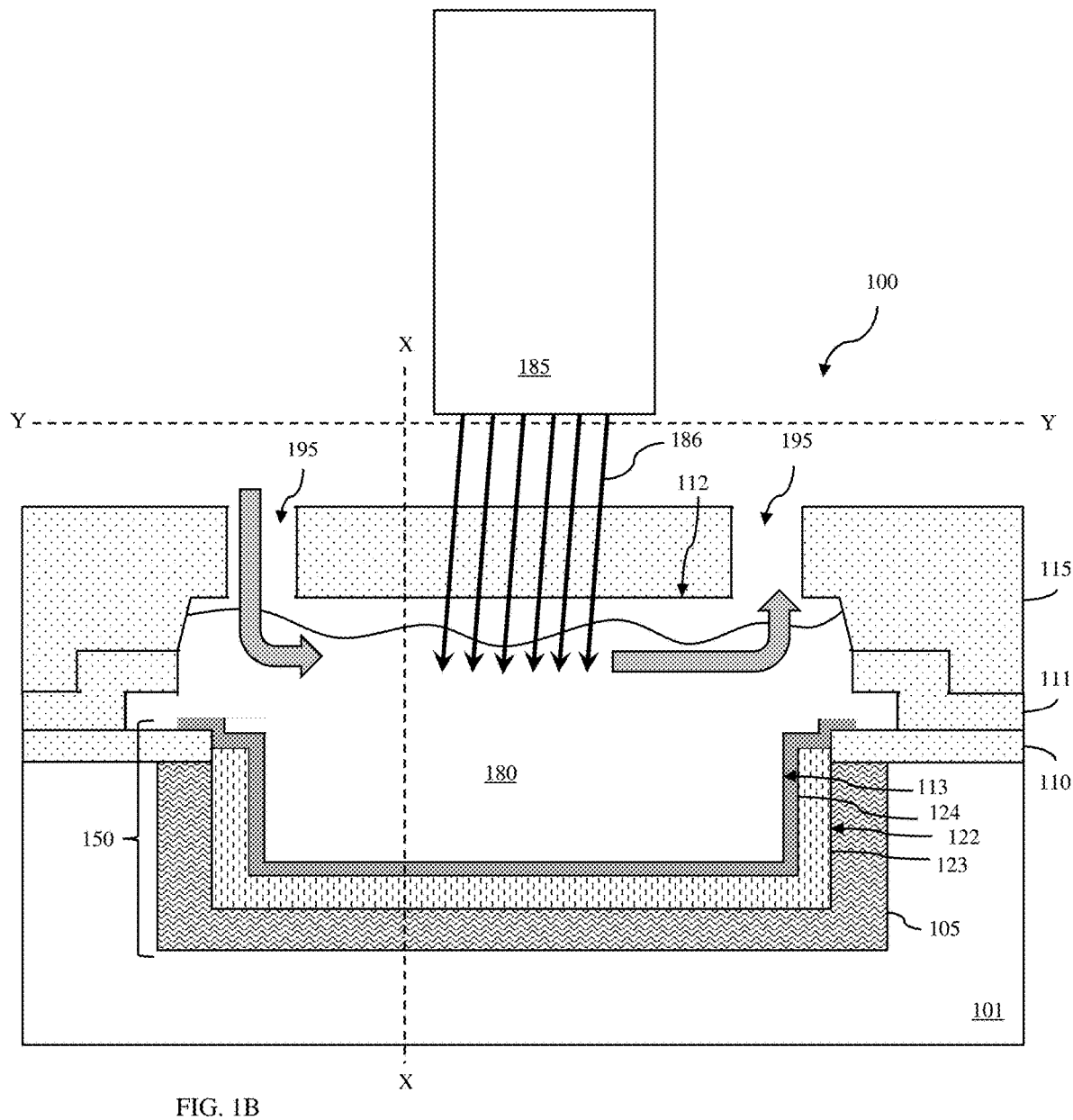
Figure 1C:
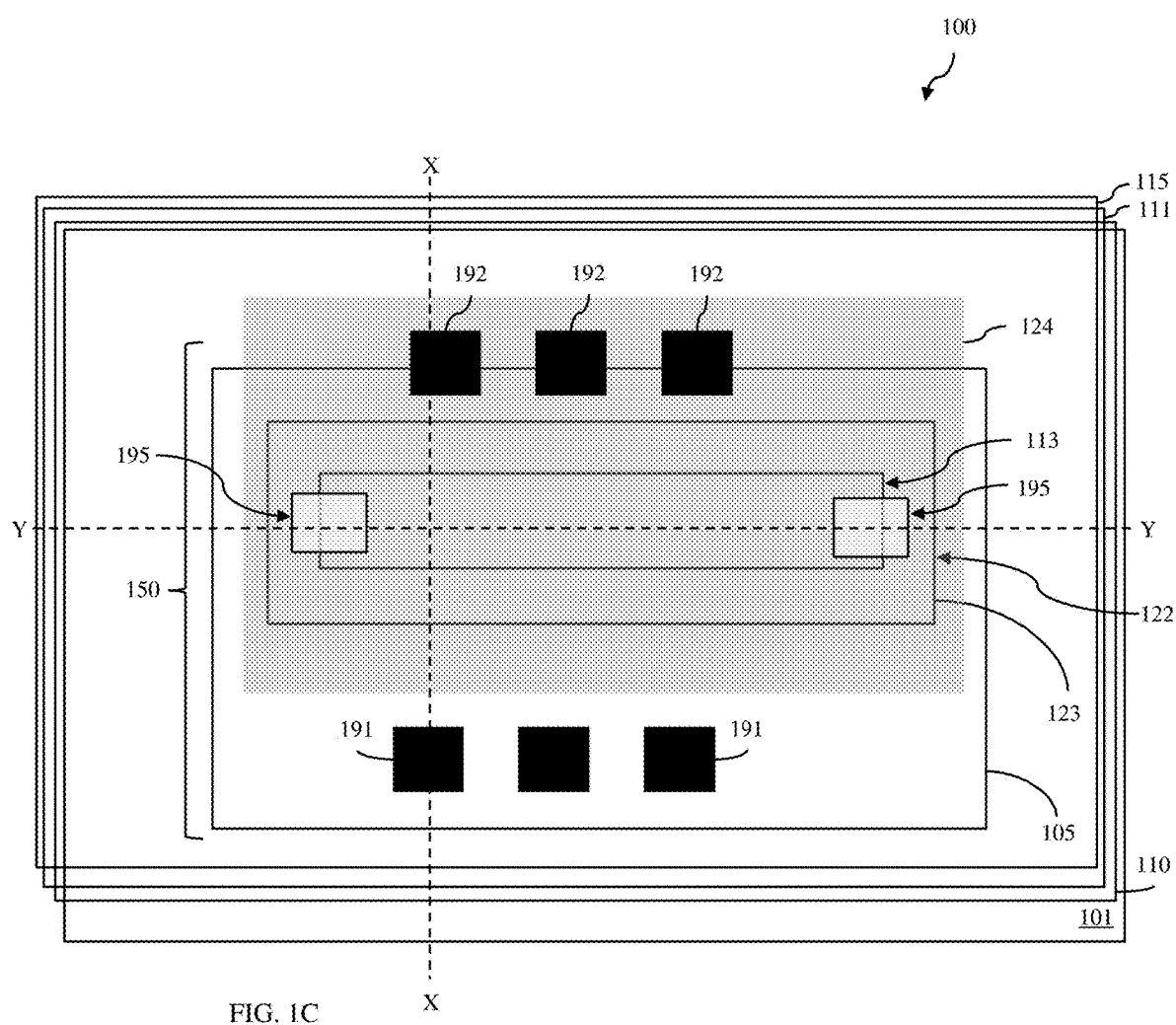

FIGS. 1A and 1B are different cross-section diagrams of an embodiment of a semiconductor structure 100 (e.g., a LOC structure) that includes a photodiode-based fluid sensor (e.g., a photodiode-based biosensor) configured for improved sensitivity. FIG. 1C is an exemplary layout diagram of the semiconductor structure 100.

Specifically, the semiconductor structure 100 can include a semiconductor substrate 101. The semiconductor substrate 101 can be, for example, a monocrystalline semiconductor substrate. The semiconductor material of the semiconductor substrate 101 can be, for example, silicon or some other suitable monocrystalline semiconductor material. The semiconductor substrate 101 can have a bottom surface and a top surface opposite the bottom surface.

The semiconductor structure 100 can further include a first dielectric layer 110 above and immediately adjacent to the top surface of the semiconductor substrate 101. This first dielectric layer 110 can be, for example, a hard mask layer, such as a silicon dioxide layer. Alternatively, this first dielectric layer 110 can be a layer of some other suitable dielectric material (e.g., silicon nitride, silicon oxynitride, etc.).

The semiconductor structure 100 can further include a photodiode-based fluid sensor. Specifically, the semiconductor structure can include a photodiode 150 (e.g., a PIN photodiode or, alternatively, a PN photodiode). The photodiode 150 can include a well region 105 (also referred to herein as a dopant implant region) in the semiconductor substrate 101. This well region 105 can extend, for example, from the top surface of the semiconductor substrate 101 (i.e., immediately adjacent to the first dielectric layer 110) to some predetermined depth below the top surface. The bottom of the well region 105 can be at or above the bottom surface of the semiconductor substrate 101. This well region 105 can have a first-type conductivity at a relatively high conductivity level. The portion of the semiconductor substrate 101 surrounding (e.g., to the sides and below) the well region 105 can have a second-type conductivity that is different from the first-type conductivity and the conductivity level of this portion of the semiconductor substrate 101 can be relatively low.

It should be understood that, throughout this specification, reference is made to semiconductor regions and/or layers having a first-type conductivity or a second-type conductivity that is different from the first-type conductivity. It should be understood that the first-type conductivity and the second-type conductivity are either N-type conductivity and P-type conductivity, respectively, or P-type conductivity and N-type conductivity, respectively. In some embodiments of the disclosed semiconductor structure 100, the well region 105 can be the N-portion of a PIN photodiode (or, alternatively, of a PN photodiode). In this case, the well region 105 could be an N+ well region within a P− portion of the semiconductor substrate. In other embodiments of the disclosed semiconductor structure 100, the well region 105 can be the P-portion of the PIN photodiode (or, alternatively, of a PN photodiode). In this case, the well region 105 could be a P+ well region within an N− portion of the semiconductor substrate 101. See the detailed discussion below regarding different dopants that can be employed in different semiconductor materials to achieve P-type conductivity or N-type conductivity.

A trench 122 can extend essentially vertically from the top surface of the first dielectric layer 110 down into the well region 105. The trench 122 can be narrower in width than the well region 105 in the X-direction, shorter in length the Y-direction, and can have a shallower depth than the well region 105. Thus, the bottom and side surfaces of the trench 122 have the first-type conductivity. In some embodiments, the width of the well region 105 in the X-direction can be approximately 2 or more times greater than the width of the trench 122 in the same direction. For example, in some embodiments the width of the trench 122 can be approximately 1 micron (μm) and the width of the trench 122 can be approximately 2 μm or more. The length of the well region 105 in the Y-direction can be significantly greater (e.g., multiple times greater) than the width in the X-direction. Similarly, the length of the trench 122 in the Y-direction can be significantly greater (e.g., multiple times greater) than the width in the X-direction.

The photodiode 150 can further include multiple conformal semiconductor layers. These conformal semiconductor layers can include a first semiconductor layer 123 and a second semiconductor layer 124.

The first semiconductor layer 123 can be immediately adjacent to the well region 105 and, more particularly, can line the bottom and all side surfaces of the trench 122 such that it is immediately adjacent to the well region 105. During processing, this first semiconductor layer 123 can be, for example, selectively epitaxially grown on the exposed semiconductor surfaces within the trench 122. Thus, the first semiconductor layer 123 can be monocrystalline in structure. Such a selective epitaxial growth process will not result in semiconductor growth from the first dielectric layer 110; however, as illustrated, the first semiconductor layer 123 may extend partially or completely up vertical surfaces of the first dielectric layer 110 at the top of the trench 122 due to overgrowth. This first semiconductor layer 123 can include one or more intrinsic semiconductor layers (i.e., one or more undoped semiconductor layers). That is, this first semiconductor layer 123 can include one or more semiconductor layers that make up the intrinsic (I)-portion of a PIN photodiode (regardless of whether the well region 105 forms the N-portion or the P-portion). However, in alternative embodiments, the first semiconductor layer 123 could be P-doped or N-doped (e.g., if the photodiode is a PN photodiode, as opposed to a PIN photodiode).

For purposes of illustration, FIGS. 1A-1C show the first semiconductor layer 123 as a single semiconductor layer. This single semiconductor layer can be, for example, a pure germanium (Ge) layer, a silicon germanium (SiGe) layer, or a single layer of some other suitable intrinsic semiconductor material.

Figure 7A:
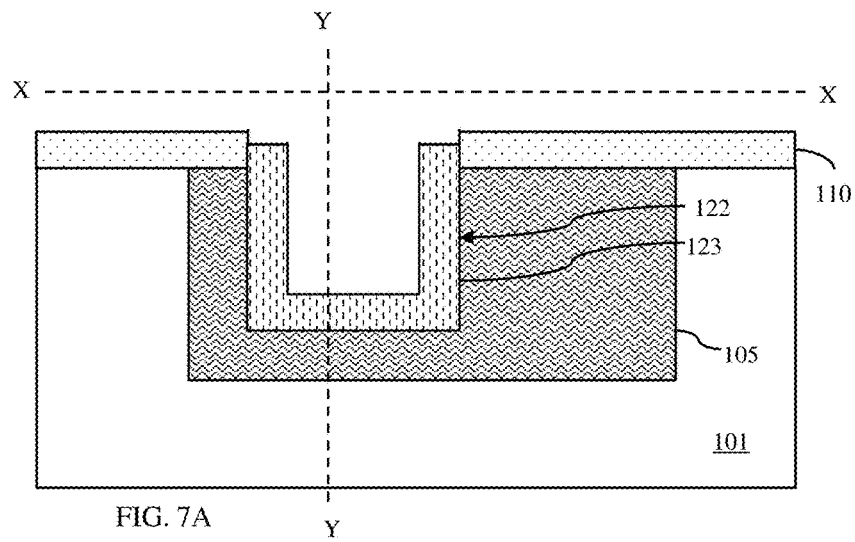
FIGS. 7A and 7B are different cross-section diagrams illustrating a partially completed semiconductor structure formed according to the flow diagram of FIG. 3.
Figure 7B:
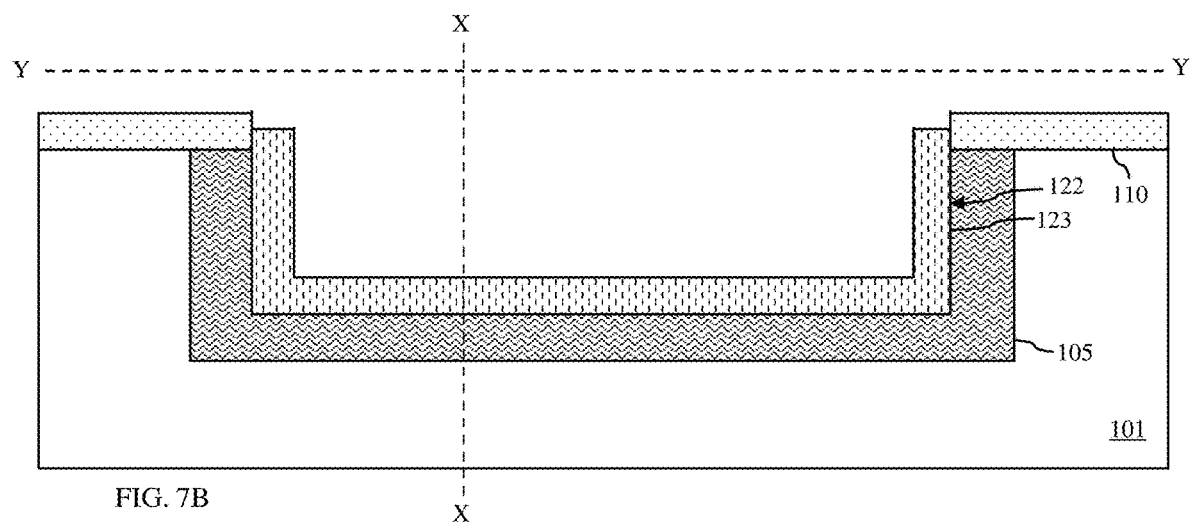
Figure 7C:
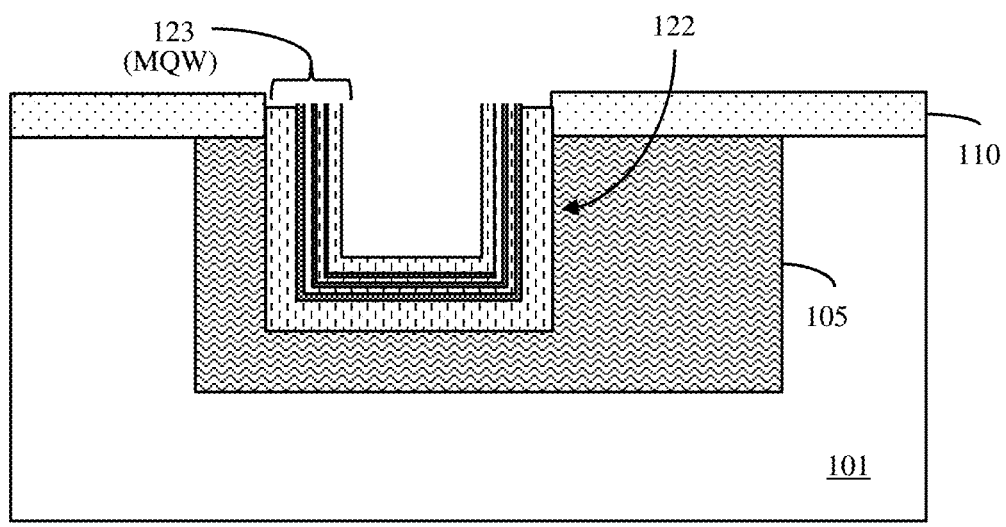
FIG. 7C corresponds to the same partially completed semiconductor structure shown in FIG. 7A and illustrates in greater detail that the first semiconductor layer can be formed as a multi-layered structure.

It should be understood that FIGS. 1A-1C are not intended to be limiting and that, as mentioned above, the first semiconductor layer 123 could, alternatively, be made up of multiple conformal semiconductor layers. For example, the first semiconductor layer 123 could be an intrinsic multi-layered structure and, particularly, a multi-quantum well (MQW) region for a MQW photodiode. As illustrated in FIG. 7C and discussed below with regard to the methods, an exemplary MQW region can include multiple intrinsic semiconductor layers including: a quantum barrier layer lining the trench and immediately adjacent to the well region; alternating quantum well and quantum barrier layers on the quantum barrier layer; and a last quantum barrier layer on the last of the quantum well layers. The multiple intrinsic semiconductor layers of the MQW region could all be SiGe layers, where the quantum barrier layers have a higher percentage of Si and a lower percentage of Ge than the quantum well layers. Alternatively, the intrinsic semiconductor layers of the MQW region could include essentially pure Si quantum barrier layers and either SiGe or pure Ge quantum well layers. Alternatively, the intrinsic semiconductor layers of the MQW region could include SiGe quantum barrier layers and essentially pure Ge quantum well layers.

The second semiconductor layer 124 can have a first portion, which is on the first semiconductor layer 123 within the trench but doesn't fill the trench 122. Specifically, within the trench 122, the first portion of the second semiconductor layer 124 can have essentially vertical sections, which are positioned laterally adjacent to essentially vertical sections of the first semiconductor layer 123 that cover the sidewalls of the trench 122, and an essentially horizontal section, which is positioned above and immediately adjacent to an essentially horizontal section of the first semiconductor layer 123 that covers the bottom of the trench 122. It should be noted that the dimensions of the trench 122 and the thicknesses of the first semiconductor layer 123 and the second semiconductor layer 124 should be such that the vertical sections of the second semiconductor layer on opposite sides of the trench 122 are physically separated by a space. The second semiconductor layer 124 can further have a second portion, which extends laterally onto the top surface of the first dielectric layer 110 outside the trench 122. During processing, this second semiconductor layer 124 can be, for example, non-selectively epitaxially grown such that it covers exposed surfaces of the first semiconductor layer 123 and the first dielectric layer 110. Thus, the first portion of the second semiconductor layer 124 will be essentially monocrystalline in structure, but the second portion adjacent to the first dielectric layer 110 will be polycrystalline. Additionally, during processing, the second semiconductor layer 124 can be patterned so that the second portion does not cover the entire top surface of the first dielectric layer 110 and so that on at least one side of the trench 122 a sufficiently large section of the second semiconductor layer 124 can function as a contact landing area. Optionally, the second semiconductor layer 124 can be patterned so that it is asymmetric relative to the opening of the trench 122. For example, on one side of the trench 122, the second portion of the second semiconductor layer 124 can overlay the well region 105 and can further extend laterally beyond a corresponding side boundary of the well region 105 to provide the contact landing area and on all other sides it can extend to just beyond the trench opening without further extending beyond the side boundaries of the well region 105.

In any case, the second semiconductor layer 124 can have the second-type conductivity at a relatively high conductivity level and, particularly, at a higher conductivity level than the portion of the semiconductor substrate 101 surrounding the well region 105. As mentioned above, in some embodiments of the disclosed semiconductor structure 100, the well region 105 can be the N-portion of a PIN photodiode (or, alternatively, of a PN photodiode). In these embodiments, the second semiconductor layer 124 can be the P-portion and, more particularly, can be a P+ semiconductor layer. In other embodiments of the disclosed semiconductor structure 100, the well region 105 can be the P-portion of the PIN photodiode. In these embodiments, the second semiconductor layer 124 can be the N-portion and, more particularly, an N+ semiconductor layer. In any case, the semiconductor material of the second semiconductor layer 124 can be the same or different than the semiconductor material(s) of the first semiconductor layer 123. For example, in some embodiments, the second semiconductor layer 124 can be a silicon layer. In other embodiments, the second semiconductor layer 124 could be a silicon germanium layer, a pure germanium layer, or any other suitable semiconductor layer doped so as to have the second-type conductivity.

The semiconductor structure 100 can further include a second dielectric layer 111. This second dielectric layer 111 can have a first section, which is above and immediately adjacent to the top surface of the first dielectric layer 110 and which laterally surrounds the outer edges of the second semiconductor layer 124, and a second section, which is continuous with but above the level of the first section and which extends over the trench 122 such that it is above and physically separated from the first and second portions of the second semiconductor layer 124 by a cavity 113 and, particularly, an air-gap that will function as a fluid reservoir. In other words, the second dielectric layer 111 covers (i.e., caps) a cavity 113, which is at least partially within the trench 122 (e.g., due to the fact that the second semiconductor layer 124 doesn't completely fill the trench) such that surfaces of the first portion of the second semiconductor layer 124 are exposed within the cavity 113. The second dielectric layer 111 can be, for example, another silicon dioxide layer or a layer of some other suitable dielectric material.

The semiconductor structure 100 can further include at least one interlayer dielectric (ILD) material layer on the second dielectric layer 111. The ILD material layer 115 can be, for example, silicon dioxide or any other suitable ILD material. During processing, openings 112 are formed in the second dielectric layer 111 in order to create the cavity 113 prior to deposition of the ILD material layer 115. Depending upon the size of each opening 112, the ILD material layer 115 may completely fill in the opening 112 (e.g., see the relatively large opening 112 on the left-side of the FIG. 1A). However, in the case of relatively small openings 112 (e.g., see the relatively small opening 112 aligned above the trench 122), the ILD material layer 115 just caps the opening(s) without filling them in. As illustrated, the bottom surface(s) of the portion(s) of the ILD material layer 115 that cap the opening(s) 112 may have concave surface(s) (e.g., with V or deep-V shape(s) extending into the ILD material layer 115).

The semiconductor structure 100 can further include at least one inlet/outlet port 195. Each inlet/outlet port 195 can extend essentially vertically from the top surface of the ILD material layer 115 down to the cavity 113. In some embodiments, the semiconductor structure 100 can include two inlet/outlet ports 195 at opposite ends of the cavity 113 (e.g., as shown in FIGS. 1B and 1C). It should be understood that the figures are not intended to be limiting and that, alternatively, the semiconductor structure 100 could have a single inlet/outlet port or more than two inlet/outlet ports. In any case, such inlet/outlet port(s) 195 can be configured to allow fluid 180 to flow through and at least partially fill the cavity 113 (i.e., the fluid reservoir), thereby contacting the surfaces of the first portion of the second semiconductor layer 124 exposed within the cavity 113.

The semiconductor structure 100 can further include various contacts. For example, one or more first contact openings can extend essentially vertically from the top surface of the ILD material layer 115 down to the well region 105 on a first side of the trench 122. Optionally, metal silicide layer(s) (not shown) can be on the surface of the well region 105 at the bottom(s) of the first contact opening(s). First contact(s) 191 can fill the first contact opening(s) such that each first contact 191 is either immediately adjacent to the top surface of the well region 105 or electrically connected thereto by a corresponding metal silicide layer (if applicable). Furthermore, one or more second contact openings can extend essentially vertically from the top surface of the ILD material layer 115 down to the second semiconductor layer 124 on a second side of the trench 122 opposite the first side and, particularly, down to a contact landing area of the second portion of the second semiconductor layer 124 (as discussed above). Optionally, metal silicide layer(s) (not shown) can be on the surface of the second semiconductor layer 124 at the bottom(s) of the second contact opening(s). Second contact(s) 192 can fill the second contact opening(s) such that each second contact 192 is either immediately adjacent to the top surface of the second semiconductor layer 124 or electrically connected thereto by a corresponding metal silicide layer (if applicable).

Those skilled in the art will recognize that in embodiments where the well region 105 is an N+ well and the second semiconductor layer 124 is a P+ semiconductor layer, the lead electrically connected to the first contact(s) 191 and thereby to the N+ well region is the cathode and the lead electrically connected to the second contact(s) 192 and thereby to the P+ semiconductor layer is the anode. Contrarily, in embodiments where the well region 105 is a P+ well and the second semiconductor layer 124 is an N+ semiconductor layer, the lead electrically connected to the first contact(s) 191 and thereby to the P+ well region is the anode and the lead electrically connected to the second contact(s) 192 and thereby to the N+ semiconductor layer is the anode.

In any case, the photodiode 150 can generate an output current that is proportional to the light that strikes it when it is illuminated. With the disclosed configuration that facilitates exposing the photodiode 150 to a fluid 180 during illumination, output current variations can also be employed to make determinations regarding the composition of the fluid 180 (e.g., when illumination specifications are fixed and known). It should be understood that to capture output current values from the photodiode 150 in response to concurrent illumination and exposure to the fluid 180, the photodiode 150 can be electrically connected to a current sensing circuit. One exemplary current sensing circuit that could be employed is a transimpedance amplifier circuit. Those skilled in the art will recognize that such a transimpedance amplifier circuit can include: an amplifier with an inverting input, a non-inverting input, and an output; and a feedback resistor connected between the output and the inverting input. The anode of the photodiode and the non-inverting input of the amplifier can both be connected to ground and the cathode of the photodiode can be connected to the inverting input of the amplifier. In this case, the voltage at the output of the amplifier (i.e., Vout) would be essentially equal to the resistance of the feedback resistor times the output current of the photodiode. Various current sensing circuits are well known in the art and, thus, such current sensing circuits have been omitted from the drawings to avoid clutter and to focus on the salient aspects of the disclosed embodiments.

Also disclosed herein are method embodiments for using the semiconductor structure described above and, particularly, for performing a fluid sensing operation using the photodiode. More specifically, referring to the flow diagram of FIG. 2, the method of performing a fluid sensing operation can include providing a semiconductor structure, such as the semiconductor structure 100 described in detail above and illustrated in FIGS. 1A-1C (see process 202).

The method for performing a fluid sensing operation can further include causing a fluid 180 (e.g., a biofluid or some other type of fluid) to flow into and at least partially fill the cavity 113 (i.e., the fluid reservoir) such that it is in contact with the exposed surfaces of the second semiconductor layer 124 of the photodiode 150 within the cavity 113 (see process 204). For example, the fluid 180 could be injected into or otherwise directed into one or more of the inlet/outlet ports 195.

The method for performing a fluid sensing operation can further include causing the photodiode 150 to be illuminated (see process 206). Illumination of the photodiode 150 can be achieve using an off-chip or on-chip light source. For purposes of illustration, FIG. 1B shows an exemplary off-chip light source 185 above the uppermost ILD material layer(s) 115 and positioned so as to direct light beams 186 toward the second semiconductor layer 124 through the various dielectric layers and the cavity 113. This off-chip light source 185 can be, for example, a laser. Alternatively, any other suitable off-chip light source can be employed (e.g., an optical fiber, such as a single mode optical fiber). Furthermore, it should be understood that the figures are not intended to be limiting and that, as mentioned above, an on-chip light source could alternatively be employed to illuminate the photodiode 150. Such an on-chip light source could include, for example, an optical waveguide with opposite ends coupled to the photodiode 150 and some other light source (e.g., an off-chip optical fiber).

It should be noted that, during the fluid sensing operation, the processes 204-206 of causing the fluid 180 to flow into the cavity 113 and causing the photodiode 150 to be illuminated are performed concurrently.

The method for performing a fluid sensing operation can further include sensing the output current of the photodiode 150 in response to these processes (i.e., in response to concurrent illumination of the photodiode and fluid flow into the cavity) (see process 208). Sensing of the output current can be performed using a current sensing circuit as described above (e.g., a transimpedance amplifier circuit).

Based on the output current level, one or more different determinations can be made regarding the composition of the fluid 180 (see process 210). Specifically, ideally, illumination of the photodiode 150 at process 206 during any given sensing operation will be according to known/fixed illumination specifications so that any variations from an expected output current are due to the fluid 180 and so that the difference between the actual and expected output currents can be employed to make some determination regarding the composition of the fluid 180. For example, the difference between the actual output current and the expected output current could indicate whether a specific target (e.g., an analyte, component, or chemical species) is detected within the fluid 180 or not and, optionally, could be used to further characterize the fluid 180 (e.g., to determine a concentration of a target in the fluid, to distinguish between targets in the fluid, etc.). Furthermore, the illumination specifications could be varied during different sensing operations (e.g., different spectrums could be used). Thus, the disclosed embodiments can be employed for spectrum-based target identification and, optionally, characterization.

Figure 3:
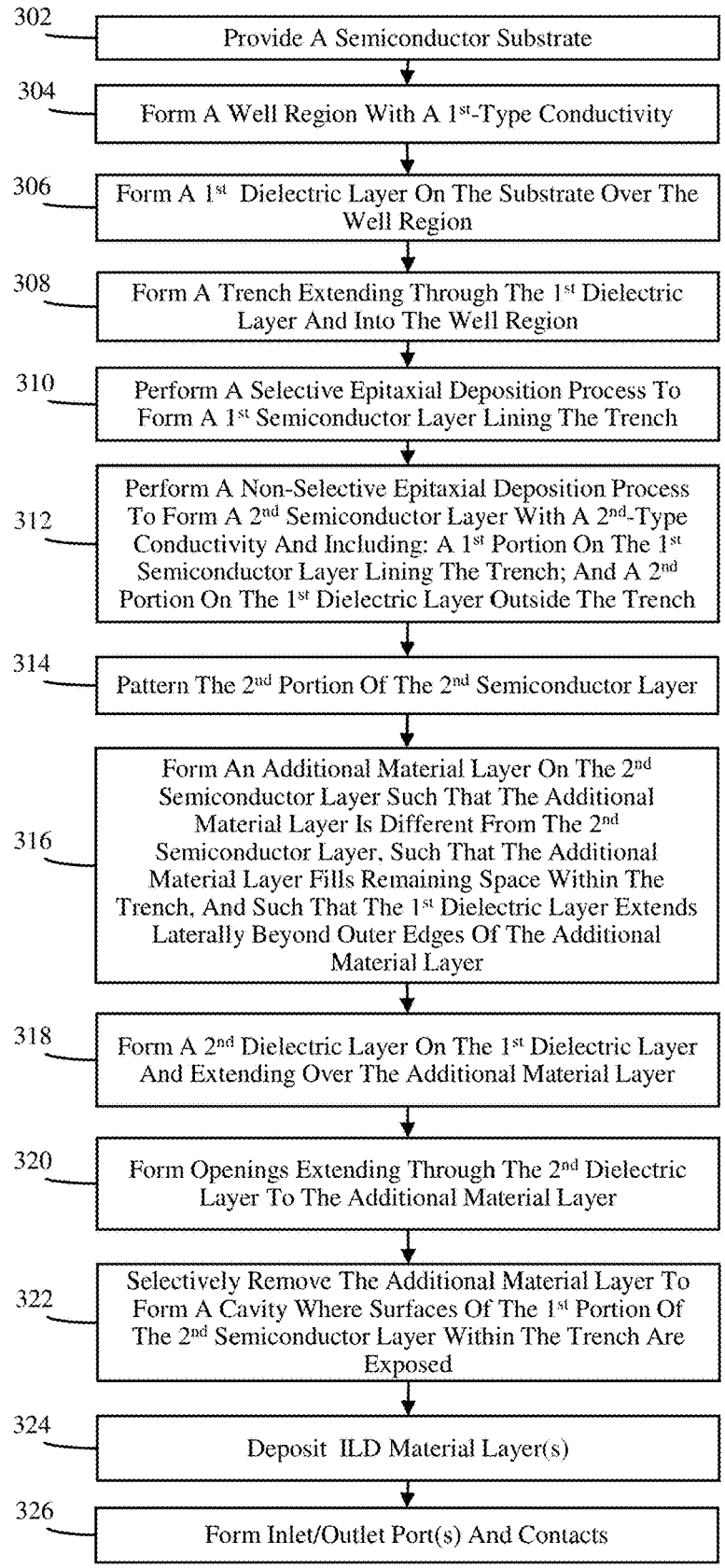
FIG. 3 is a flow diagram illustrating an embodiment of a method of forming the semiconductor structure of FIGS. 1A-1C.

Referring to the flow diagram of FIG. 3, also disclosed herein are method embodiments for forming the semiconductor structure 100 described above and illustrated in FIGS. 1A-1C.

Figure 4A:
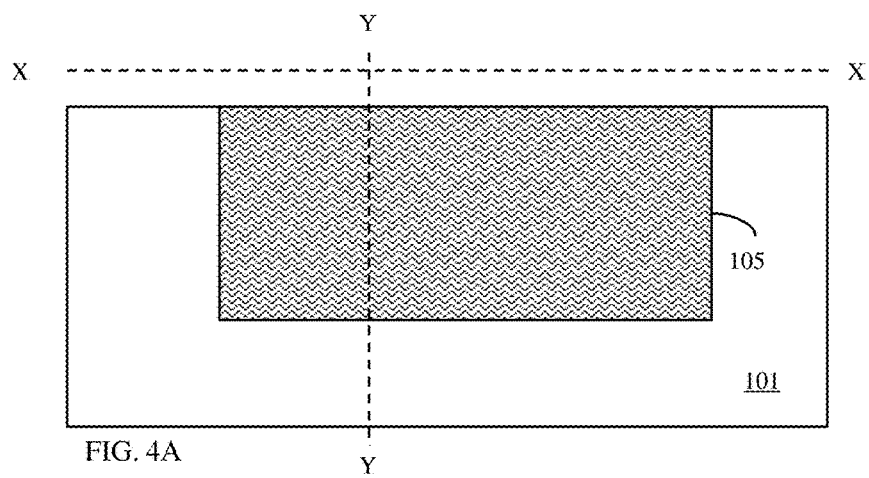
FIGS. 4A and 4B are different cross-section diagrams illustrating a partially completed semiconductor structure formed according to the flow diagram of FIG. 3
Figure 4B:
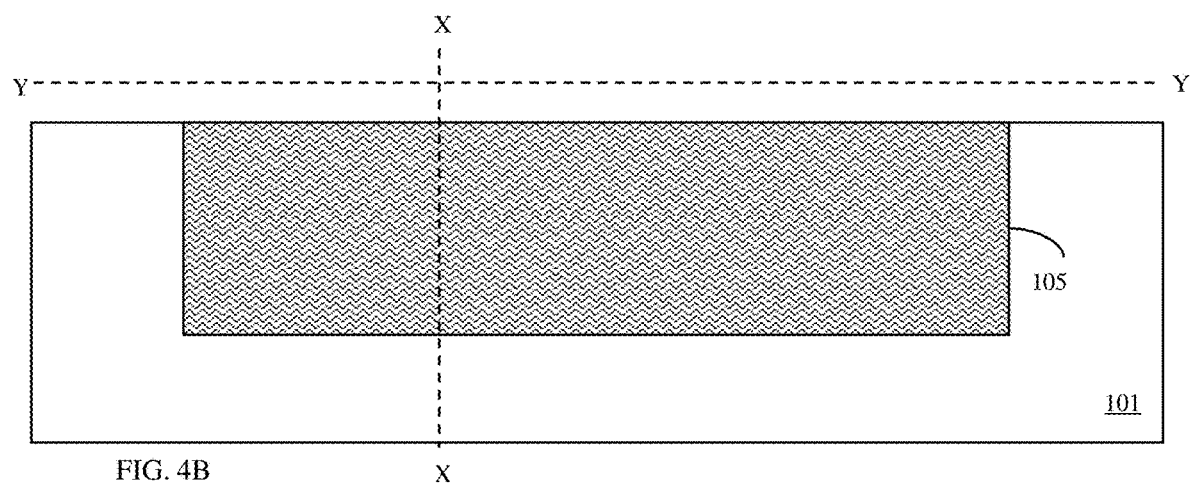
Figure 4C:
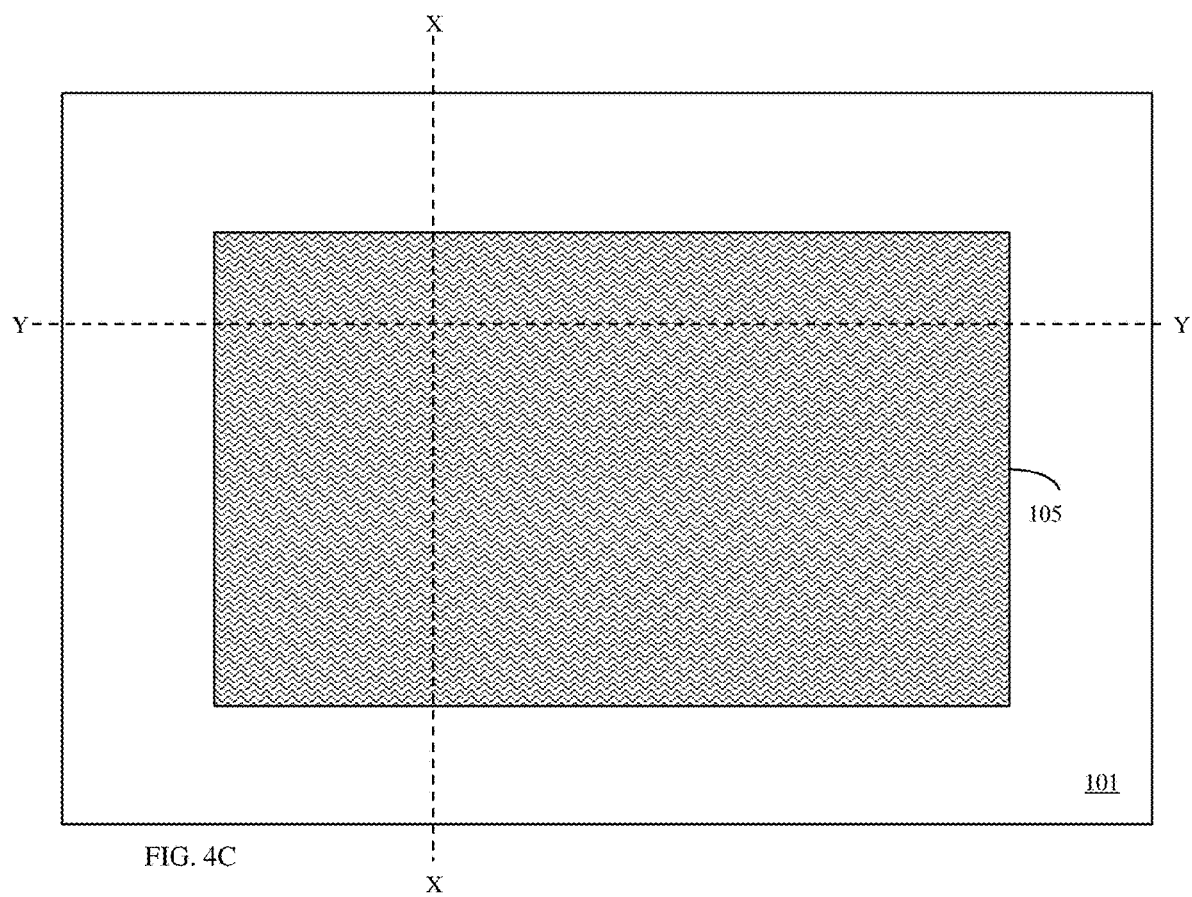
FIG. 4C is a top view diagram of the same partially completed semiconductor structure.

This method can include providing a semiconductor substrate 101 (see process 302 as well as the two different cross-section diagrams of FIGS. 4A-4B and the top view diagram of FIG. 4C). The semiconductor substrate 101 can be, for example, a monocrystalline semiconductor substrate. The semiconductor material of the semiconductor substrate 101 can be, for example, silicon or some other suitable monocrystalline semiconductor material. The semiconductor substrate 101 can have a bottom surface and a top surface opposite the bottom surface. The method can further include forming the above-described semiconductor structure 100, including a photodiode 150, using the semiconductor substrate 101.

To form the photodiode 150, a well region 105 can be formed in the semiconductor substrate 101 adjacent to the top surface and extending some predetermined depth below the top surface (see process 304 and FIGS. 4A-4C). The well region 105 can be formed, for example, by forming a mask layer on the top surface of the substrate, forming an opening in the mask layer (e.g., using conventional lithographic patterning and etch processes) to expose a portion of the semiconductor substrate, and performing a dopant implantation process to form the well region 105 in the exposed portion of the semiconductor substrate 101. The dopant implantation process can be performed such that the well region 105 has a first-type conductivity at a relatively high conductivity level. It should be noted the portion of the semiconductor substrate 101 surrounding (e.g., to the sides and below) the well region 105 can have a second-type conductivity that is different from the first-type conductivity and the conductivity level of this portion of the semiconductor substrate 101 can be relatively low.

As mentioned above, throughout this specification, reference is made to semiconductor regions and/or layers having a first-type conductivity or a second-type conductivity that is different from the first-type conductivity. The first-type conductivity and the second-type conductivity are either N-type conductivity and P-type conductivity, respectively, or P-type conductivity and N-type conductivity, respectively. In some embodiments, the well region 105 will be the N-portion of a PIN photodiode. In this case, the dopant implantation process can be performed so that the well region 105 is an N+ well region within a P− portion of the semiconductor substrate. In other embodiments, the well region 105 will be the P-portion of the PIN photodiode. In this case, the dopant implantation process can be performed such that the well region 105 is a P+ well region within an N− portion of the semiconductor substrate 101. See the detailed discussion below regarding different dopants that can be employed in different semiconductor materials to achieve P-type conductivity or N-type conductivity.

Figure 5A:
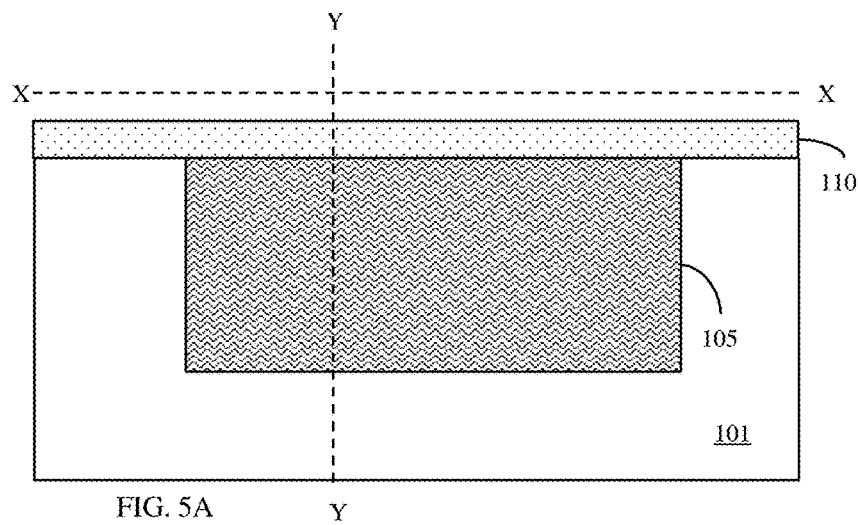
FIGS. 5A and 5B are different cross-section diagrams illustrating a partially completed semiconductor structure formed according to the flow diagram of FIG. 3.
Figure 5B:
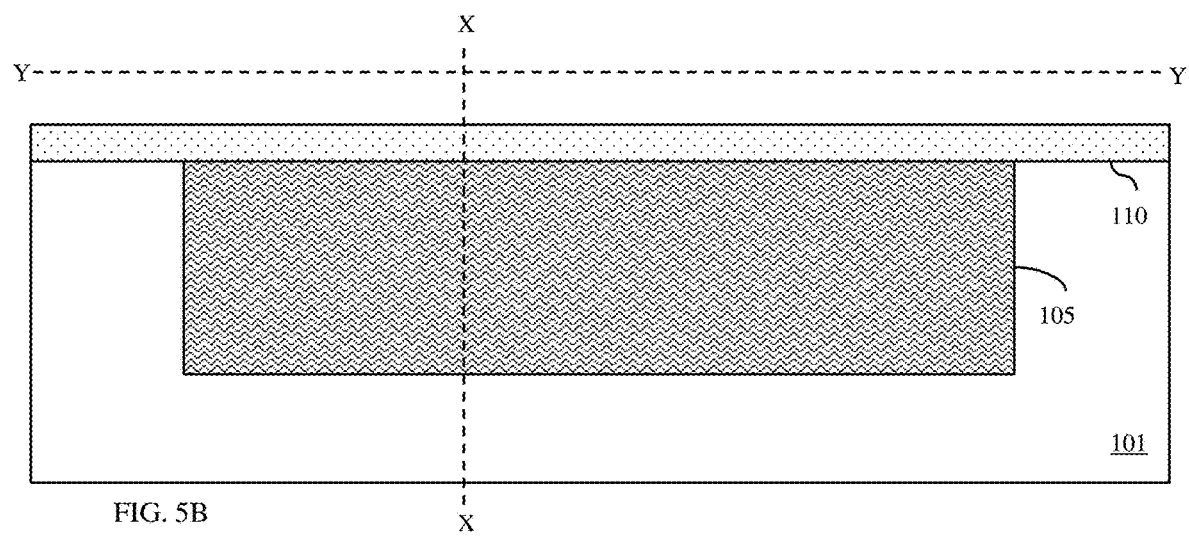

A first dielectric layer 110 can be formed (e.g., deposited or otherwise formed) on the top surface of the semiconductor substrate 101 over the well region 105 (see process 306 and FIGS. 5A-5B). This first dielectric layer 110 can be, for example, a hard mask layer, such as a silicon dioxide layer. Alternatively, this first dielectric layer 110 can be made of some other suitable dielectric material (e.g., silicon nitride, silicon oxynitride, etc.).

Figure 6A:
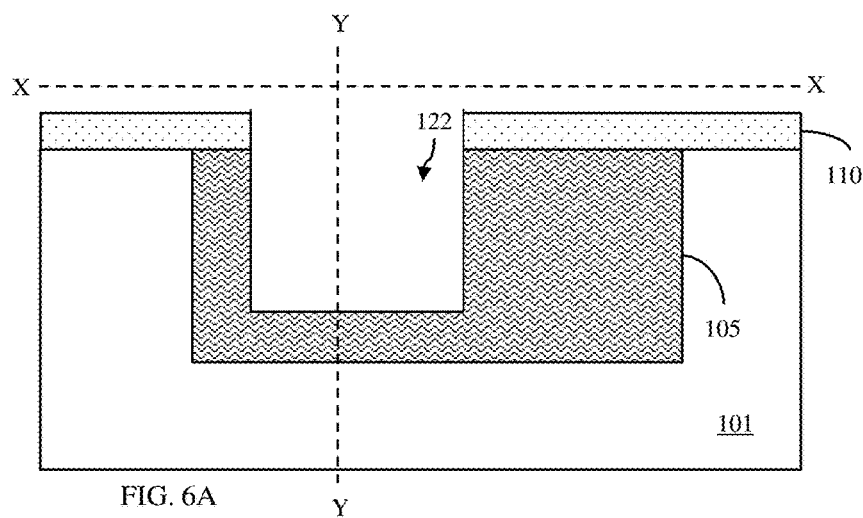
FIGS. 6A and 6B are different cross-section diagrams illustrating a partially completed semiconductor structure formed according to the flow diagram of FIG. 3.
Figure 6B:
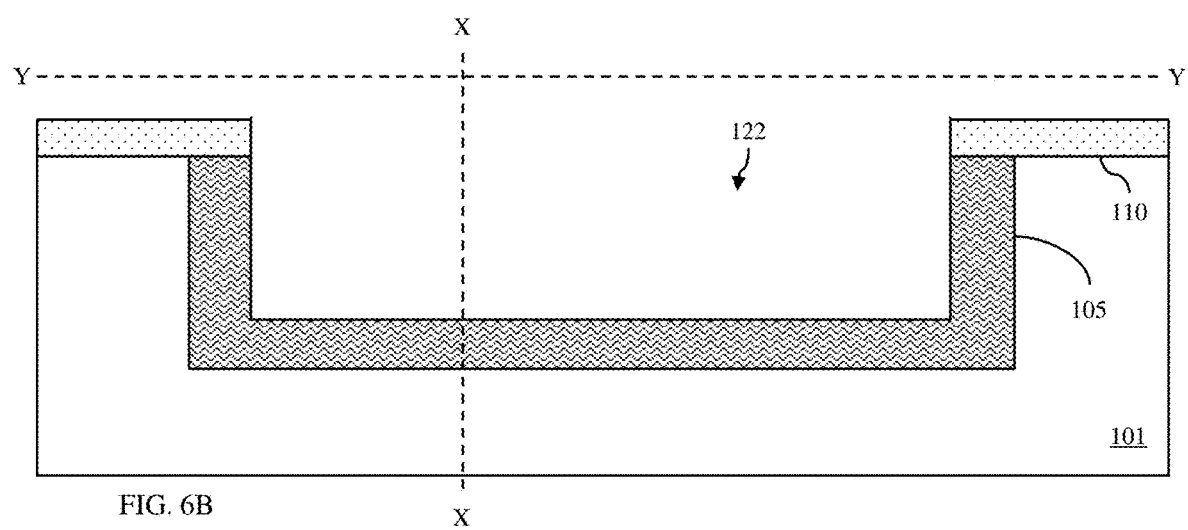

A trench 122 can be formed such that it extends through the first dielectric layer 110 and into the well region 105 (see process 308 and FIGS. 6A-6B). This trench 122 can be formed, for example, using conventional lithographic patterning and etch techniques. In any case, the trench 122 can be formed so that it extends essentially vertically from the top surface of the first dielectric layer 110 down into the well region 105. The trench 122 can be formed such that it is narrower in width than the well region 105 in the X-direction, such that it is shorter in length the Y-direction, and such that it is shallower in depth than the well region 105. In some embodiments, the width of the well region 105 in the X-direction can be approximately 2 or more times greater than the width of the trench 122 in the same direction. For example, in some embodiments the width of the trench 122 can be approximately 1 micron (μm) and the width of the trench 122 can be approximately 2 μm or more. The length of the well region 105 in the Y-direction can be significantly greater (e.g., multiple times greater) than the width in the X-direction. Similarly, the length of the trench 122 in the Y-direction can be significantly greater (e.g., multiple times greater) than the width in the X-direction.

To form the photodiode multiple conformal semiconductor layers can be formed. Specifically, a first semiconductor layer 123 can be formed so as to line the trench 122 (see process 310 and FIGS. 7A-7B). For example, the first semiconductor layer 123 can be selectively epitaxially grown on the exposed semiconductor surfaces within the trench 122. Thus, the first semiconductor layer 123 can be monocrystalline in structure. Such a selective epitaxial growth process will not result in semiconductor growth from the first dielectric layer 110; however, as illustrated, the first semiconductor layer 123 may extend partially or completely up vertical surfaces of the first dielectric layer 110 at the top of the trench 122 due to overgrowth. This first semiconductor layer 123 can include one or more intrinsic semiconductor layers (i.e., one or more undoped semiconductor layers). That is, this first semiconductor layer 123 can include one or more semiconductor layers that make up the intrinsic (I)-portion of a PIN photodiode (regardless of whether the well region 105 forms the N-portion or the P-portion). For purposes of illustration, FIGS. 7A-7B show the first semiconductor layer 123 as a single intrinsic semiconductor layer. This single intrinsic semiconductor layer can be, for example, a pure germanium (Ge) layer, a silicon germanium (SiGe) layer, or a single layer of some other suitable intrinsic semiconductor material. Alternatively, the first semiconductor layer 123 could be formed as a MQW region (e.g., as illustrated in the alternatively XX cross-section of FIG. 7C). An exemplary MQW region can include multiple intrinsic semiconductor layers including: a quantum barrier layer lining the trench and immediately adjacent to the well region; alternating quantum well and quantum barrier layers on the quantum barrier layer; and a last quantum barrier layer on the last of the quantum well layers. The multiple intrinsic semiconductor layers of the MQW region could all be SiGe layers, where the quantum barrier layers have a higher percentage of Si and a lower percentage of Ge than the quantum well layers. Alternatively, these intrinsic semiconductor layers could include essentially pure Si quantum barrier layers and either SiGe or pure Ge quantum well layers. Alternatively, the intrinsic semiconductor layers can include SiGe quantum barrier layers and essentially pure Ge quantum well layers. Alternatively, the first semiconductor layer 123 could be P-doped or N-doped (e.g., in the case of a PN photodiode).

Figure 8A:
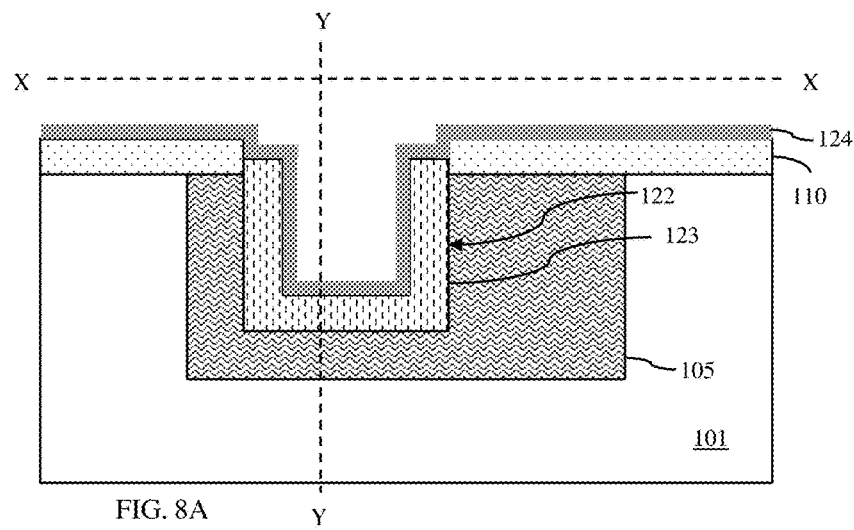
FIGS. 8A and 8B are different cross-section diagrams illustrating a partially completed semiconductor structure formed according to the flow diagram of FIG. 3.
Figure 8B:
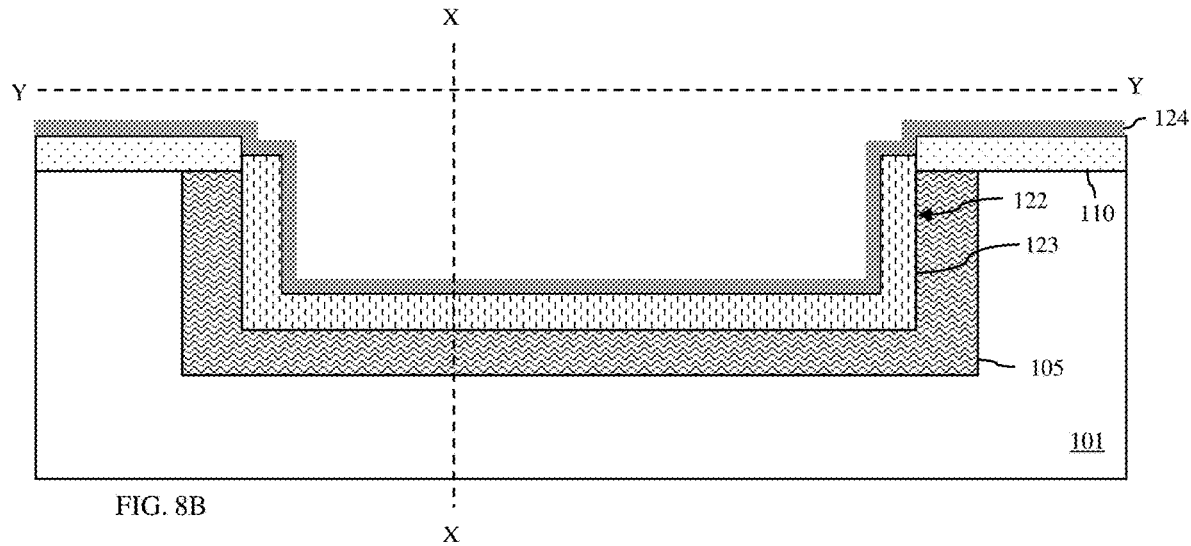

Following formation of the first semiconductor layer 123, a second semiconductor layer 124 can be formed. This second semiconductor layer 124 can be non-selectively epitaxially grown such that it includes a first portion, which is monocrystalline in structure and covers the first semiconductor layer 123 within the trench but doesn't fill the trench 122, and a second portion, which is polycrystalline in structure and on the first dielectric layer 110 (see process 312 and FIGS. 8A-8B). The second semiconductor layer 124 can further be in situ doped at process 312 so as to have the second-type conductivity at a relatively high conductivity level and, particularly, at a higher conductivity level than the portion of the semiconductor substrate 101 surrounding the well region 105. As mentioned above, in some embodiments, the well region 105 will be the N-portion of a PIN photodiode (or PN photodiode, if applicable). In these embodiments, the second semiconductor layer 124 will be the P-portion and, more particularly, will be in situ doped at process 312 so as to be a P+ semiconductor layer. In other embodiments, the well region 105 will be the P-portion of the PIN photodiode (or PN photodiode, if applicable). In these embodiments, the second semiconductor layer 124 will be the N-portion and, more particularly, will be in situ doped at process 312 so as to be an N+ semiconductor layer. In any case, the semiconductor material of the second semiconductor layer 124 can be the same or different than the semiconductor material(s) of the first semiconductor layer 123. For example, in some embodiments, the second semiconductor layer 124 can be a silicon layer. In other embodiments, the second semiconductor layer 124 could be a silicon germanium layer, a pure germanium layer, or any other suitable semiconductor layer doped so as to have the second-type conductivity.

Figure 9A:
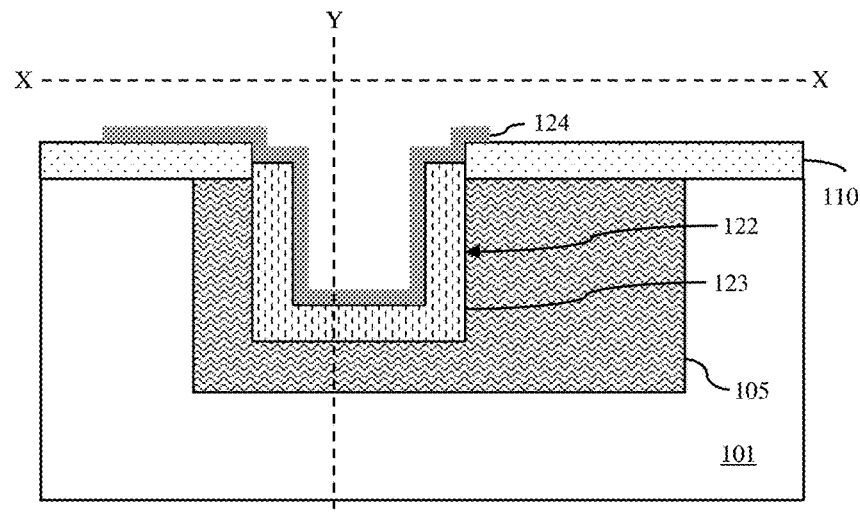
FIGS. 9A and 9B are different cross-section diagrams illustrating a partially completed semiconductor structure formed according to the flow diagram of FIG. 3.
Figure 9B:
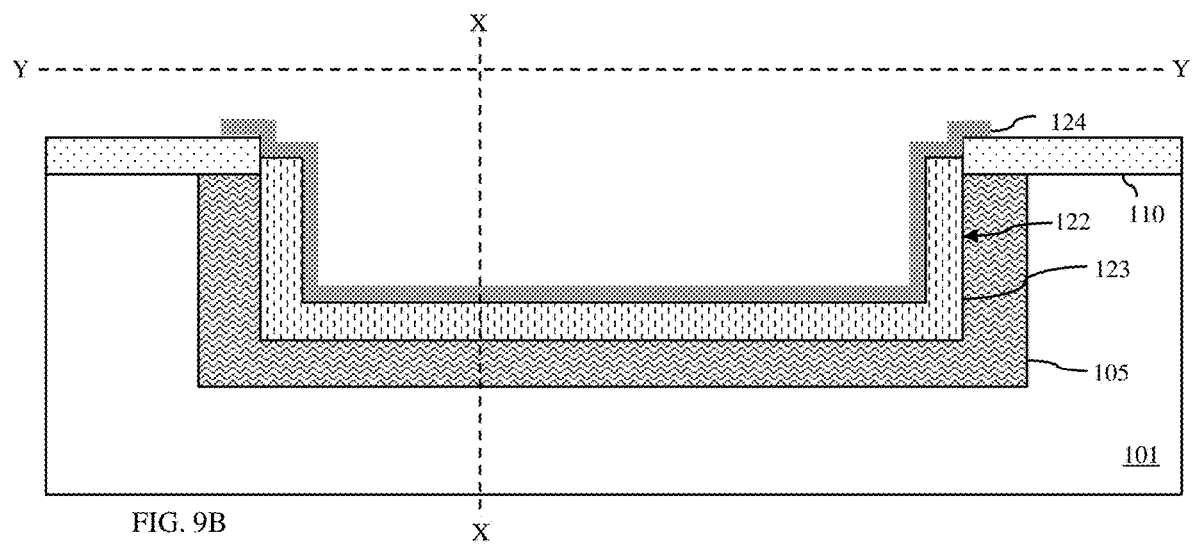

The second semiconductor layer 124 can subsequently patterned (e.g., lithographically patterned and etched) so that the second portion does not cover the entire top surface of the first dielectric layer 110 (see process 314 and FIGS. 9A-9B). Specifically, patterning at process 314 can be performed so that on at least one side of the trench 122 a sufficiently large section of the second semiconductor layer 124 can function as a contact landing area and so that on another side of the trench the second semiconductor layer 124 is removed to allow the well region 105 to be contacted. Thus, the second semiconductor layer 124 may be asymmetric relative to the opening of the trench 122.

Figure 10A:
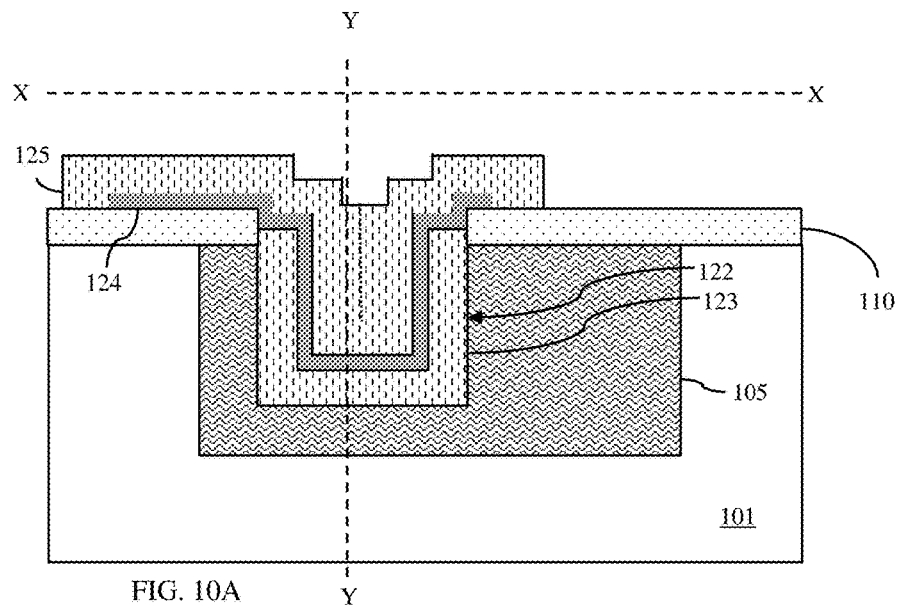
FIGS. 10A and 10B are different cross-section diagrams illustrating a partially completed semiconductor structure formed according to the flow diagram of FIG. 3.
Figure 10B:
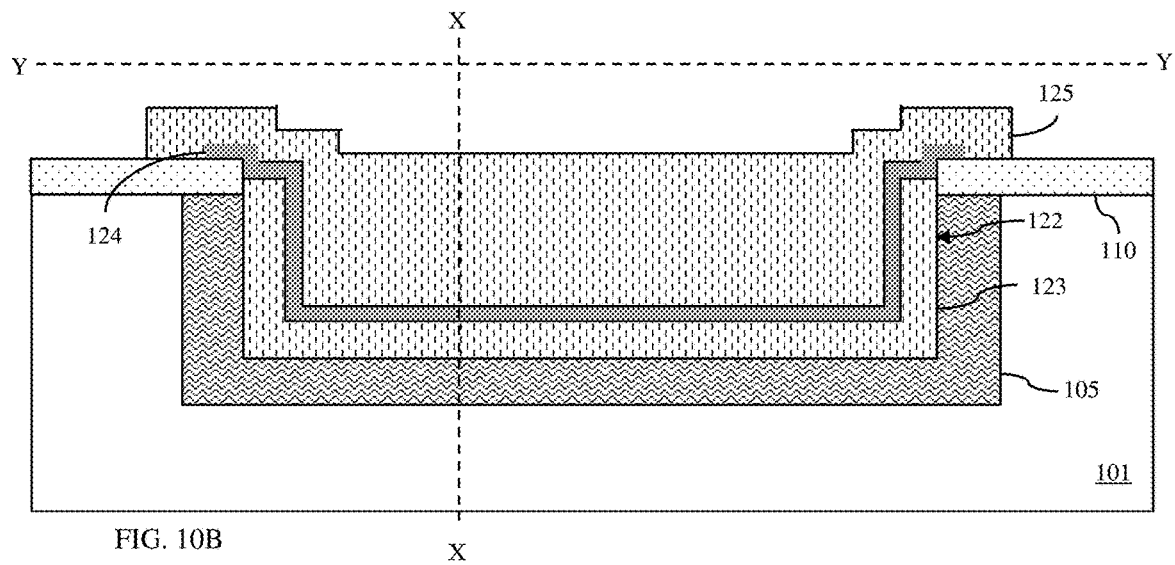

An additional material layer 125 and, particularly, a sacrificial material layer can be formed over the second semiconductor layer 124 including filling the remaining space within the trench 122 and further extending over the second portion of the second semiconductor layer and onto the first dielectric layer (see process 316 and FIGS. 10A-10B). In some embodiments, this additional material layer 125 can be an additional semiconductor layer, which is selectively epitaxially grown on exposed surfaces of the second semiconductor layer 124 and which is made of a different semiconductor material than the second semiconductor layer 124 such that it can be selectively removed, while leaving the second semiconductor layer 124 essentially intact during subsequent processing (see process 322 discussed below). Thus, for example, if the second semiconductor layer 124 is a silicon layer, the additional material layer 125 could be a pure germanium layer, a silicon germanium layer, or a layer of some other suitable semiconductor material that can be selectively etched over silicon. It should be noted that, due to the selectively epitaxial growth process, this additional semiconductor layer would limited in size and would not cover the first dielectric layer 110 so no additional processing would be necessary. However, alternatively, any other suitable sacrificial material layer that could be selectively etched over the second semiconductor layer 124 could be deposited and patterned (e.g., lithographically patterned and etched) so as to cover the second semiconductor layer and expose the top surface of the adjacent first dielectric layer 110.

Figure 2:
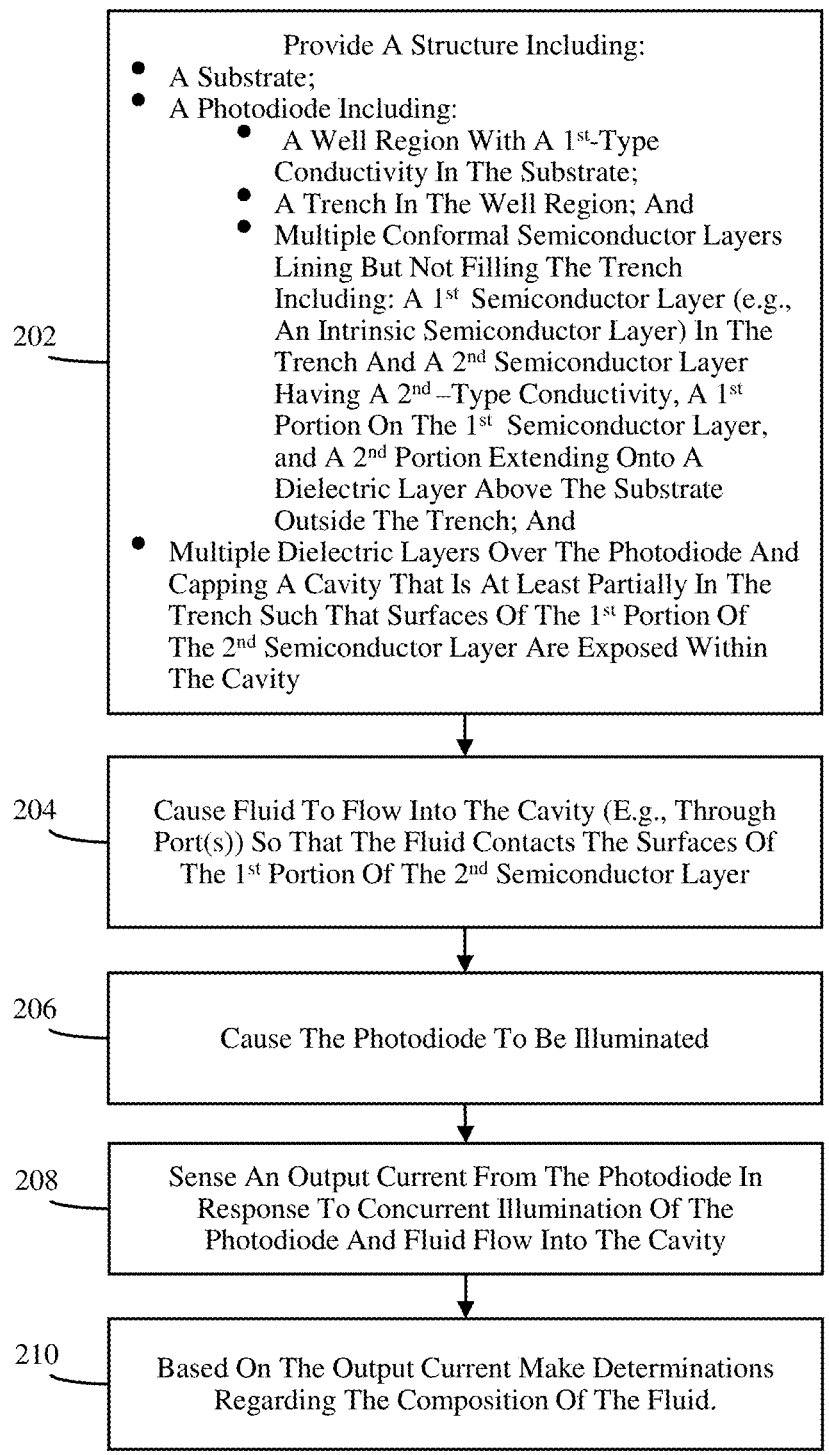
FIG. 2 is a flow diagram illustrating an embodiment of a method of performing a fluid sensing operation using a photodiode-based fluid sensor, as illustrated in FIGS. 1A-1C.
Figure 11A:
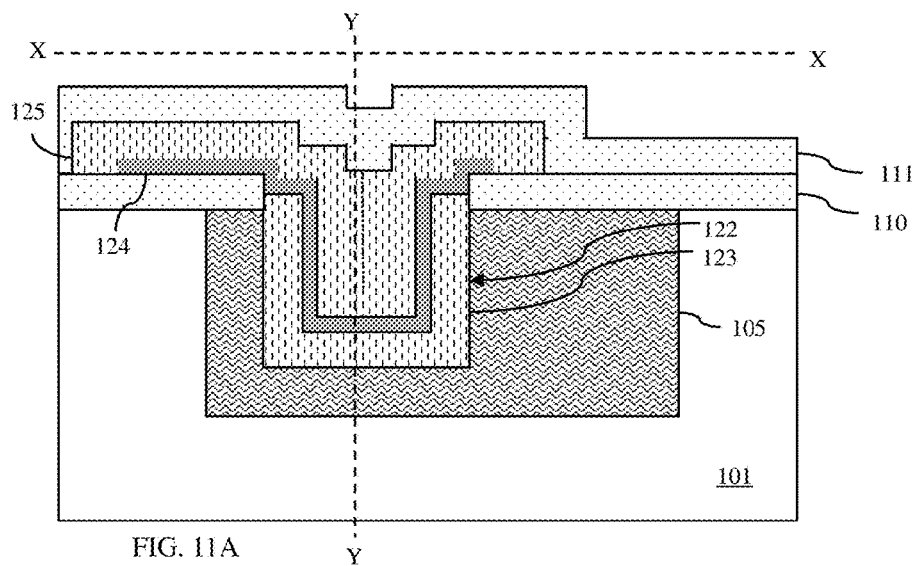
FIGS. 11A and 11B are different cross-section diagrams illustrating a partially completed semiconductor structure formed according to the flow diagram of FIG. 3.
Figure 11B:
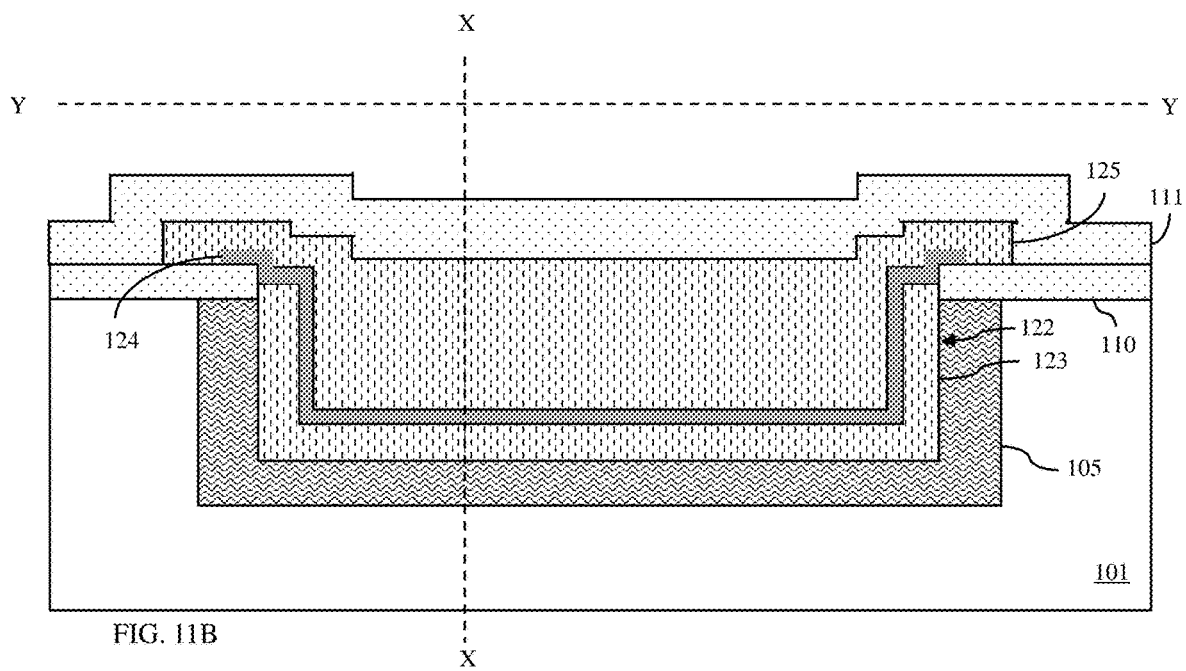
Figure 12A:
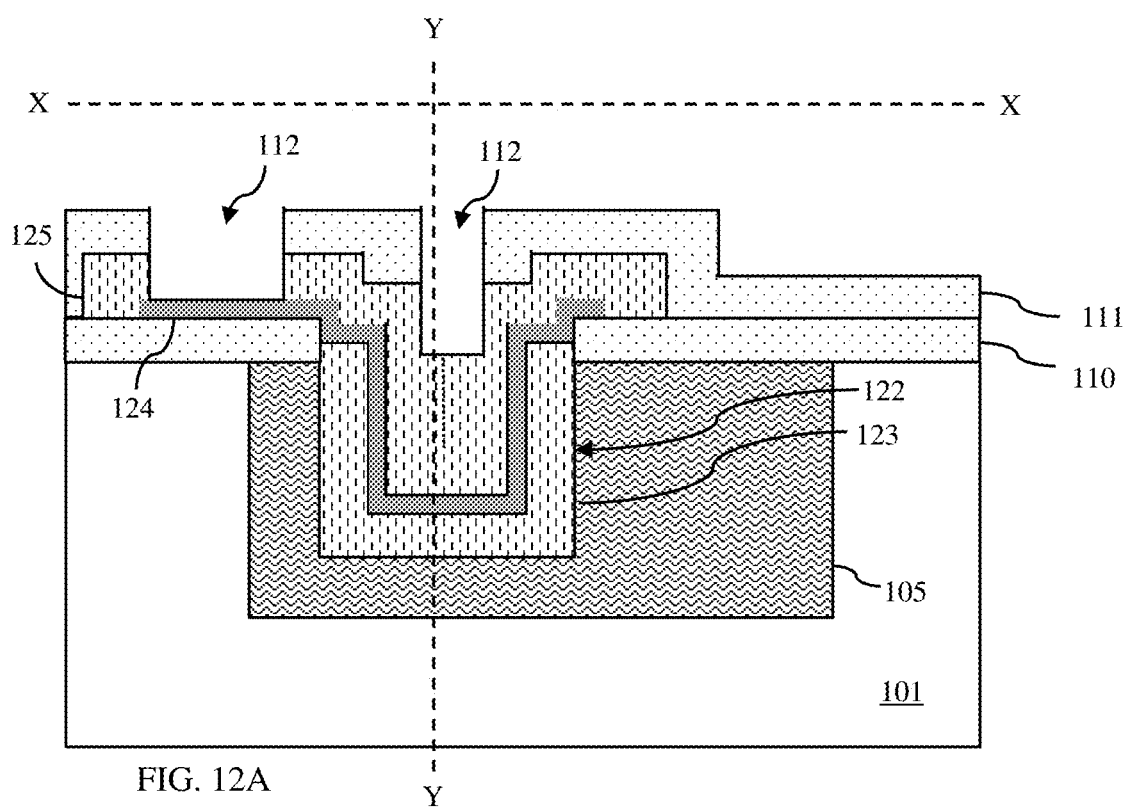
FIGS. 12A and 12B-1 or, alternatively, 12B-2 are different cross-section diagrams illustrating a partially completed semiconductor structure formed according to the flow diagram of FIG. 3.
Figures 1, 12B:
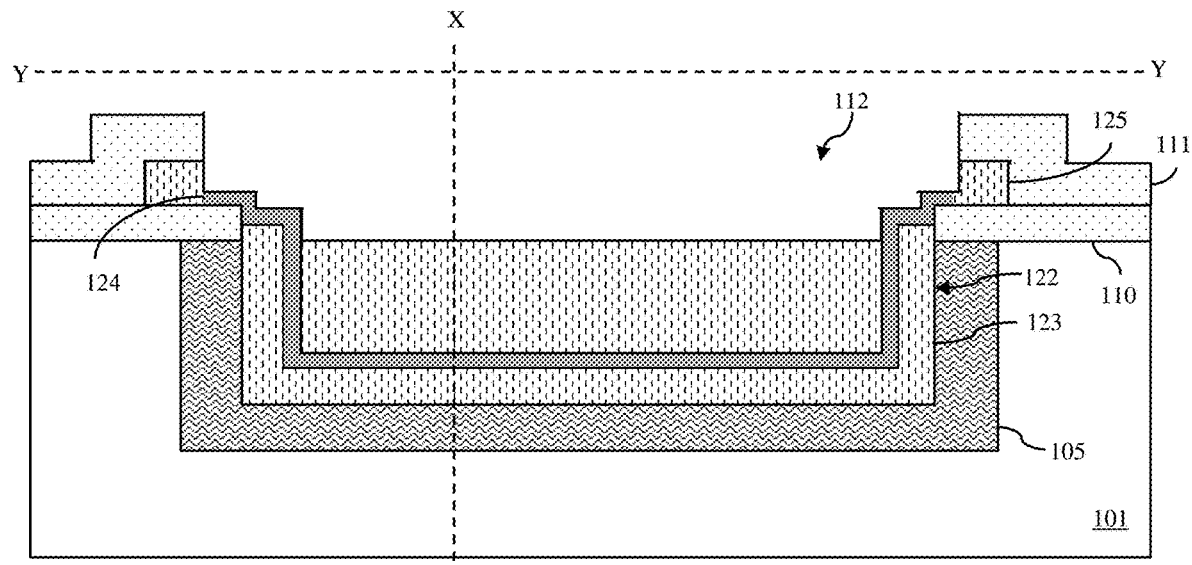
Figures 2, 12B:
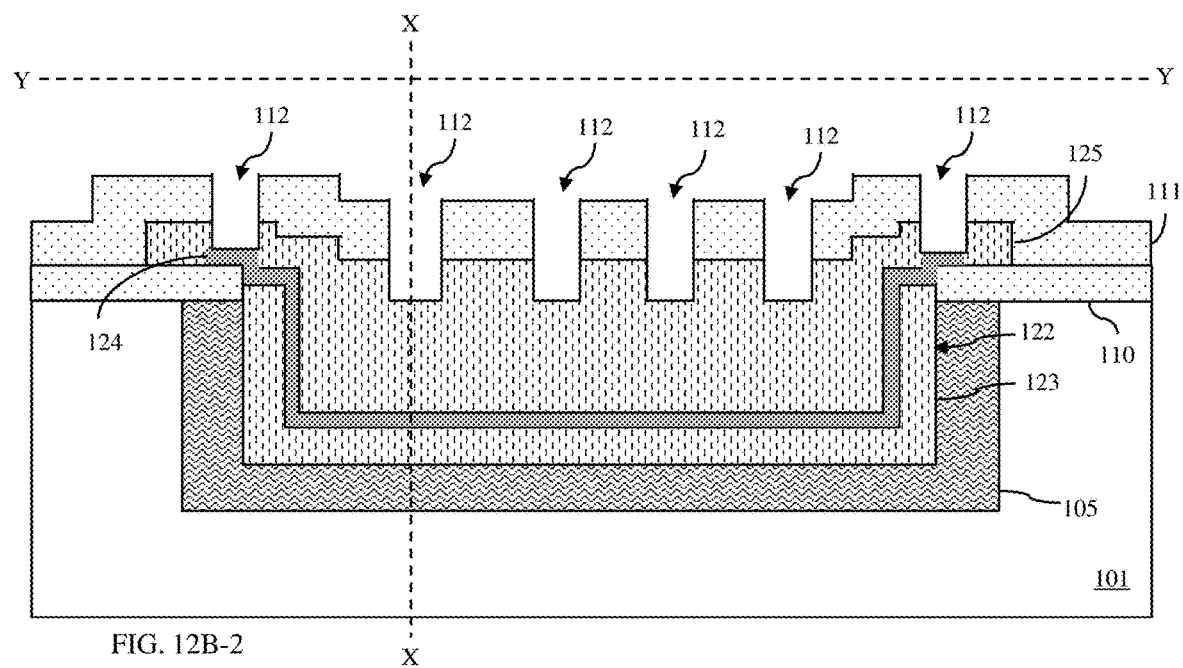
Figure 13A:
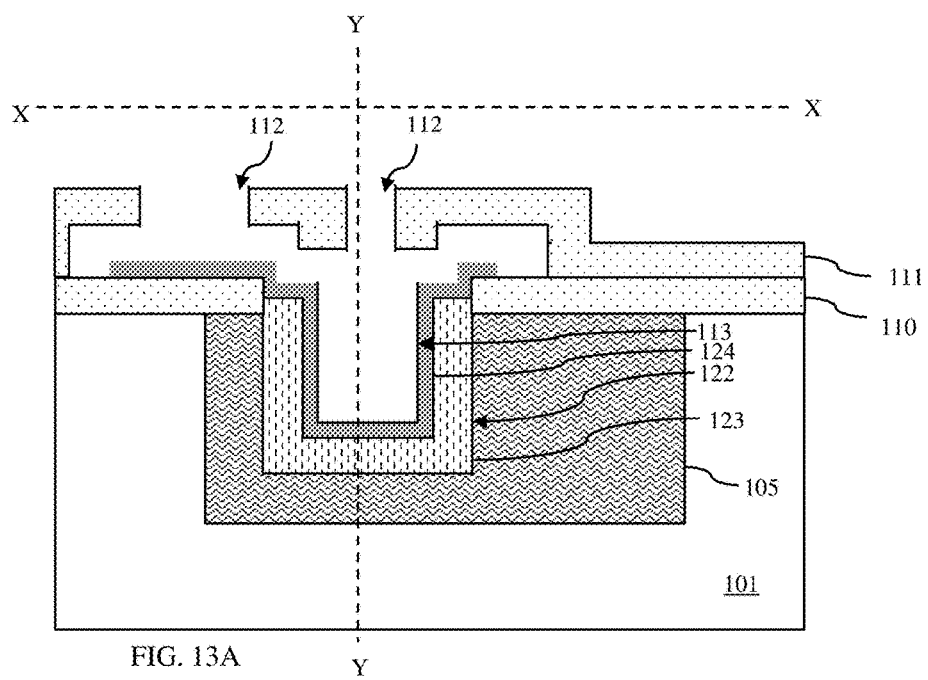
FIGS. 13A and 13B are different cross-section diagrams illustrating a partially completed semiconductor structure formed according to the flow diagram of FIG. 3.
Figure 13B:
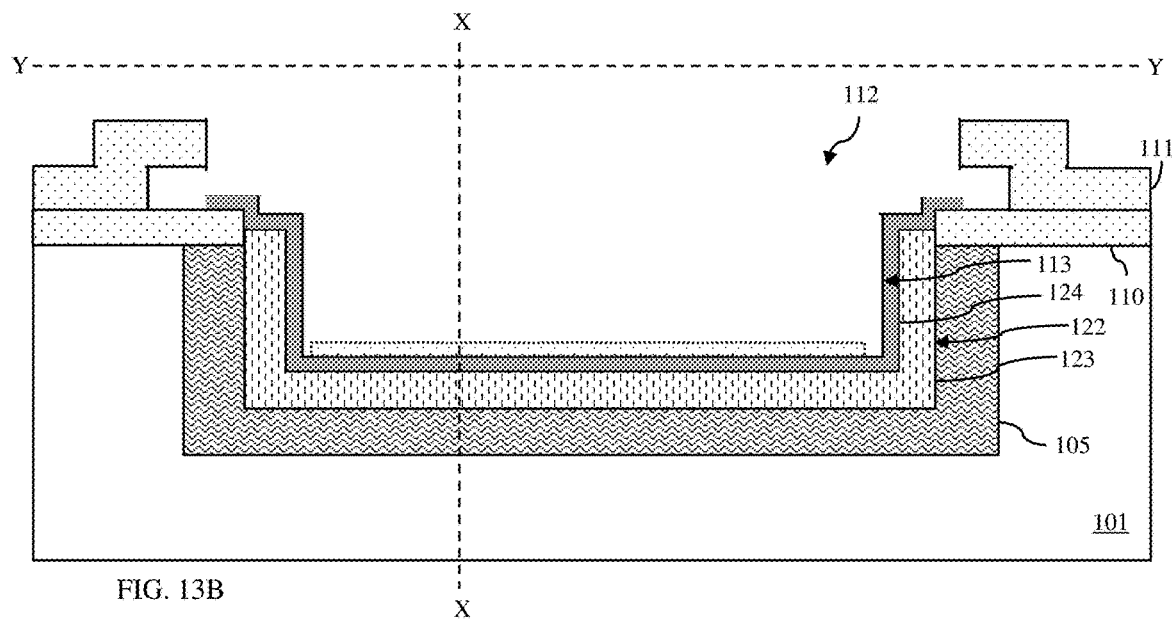

A second dielectric layer 111 can be formed (e.g., deposited or otherwise formed) over the partially completed structure (see process 318 and FIGS. 11A-11B). This second dielectric layer 111 can be a silicon dioxide layer or a layer of some other suitable dielectric material (e.g., silicon nitride, silicon oxynitride, etc.). Openings 112 can be formed (e.g., lithographically patterned and etched) such that they extend through the second dielectric layer 111 to the additional material layer 125 or, optionally, into the additional material layer 125 (see process 320 and FIGS. 12A and 12B-1 or 12B-2). One or more relatively long openings (e.g., channels) can be formed at process 320 (e.g., traversing the device in the Y-direction, as illustrated in FIG. 12B-1). Multiple relatively small openings can be formed at process 220 (e.g., arranged in a line that traverses the length of the device in the Y-direction, as illustrated in FIG. 12B-2). The openings 112 provide access to the additional material layer 125 so that the additional material layer 125 can be selectively removed (see process 322 and FIGS. 13A-13B). For example, a selective isotropic etch process can be performed to remove the additional material layer 125, while leaving the second semiconductor layer 124 and surrounding dielectric materials intact. Techniques for forming such selective isotropic etch processes are well known and those skilled in the art will recognize that the etch specifications will vary depending upon the materials at issue. For example, if the additional material layer 125 is a germanium or silicon germanium layer and the second semiconductor layer 124 is a silicon layer, then a chlorine-based selective etch process can be performed in order to selectively remove the additional material layer 125 at process 316. In any case, removal of the additional material layer 125 results in the formation of a cavity 113 (i.e., an air-gap, fluid reservoir, etc.) that is capped by (i.e., covered by) the second dielectric layer 111 and that extends, at least partially, into the trench 122 such that surfaces of the first portion of the second semiconductor layer 124 are exposed within the cavity 113.

Figure 14A:
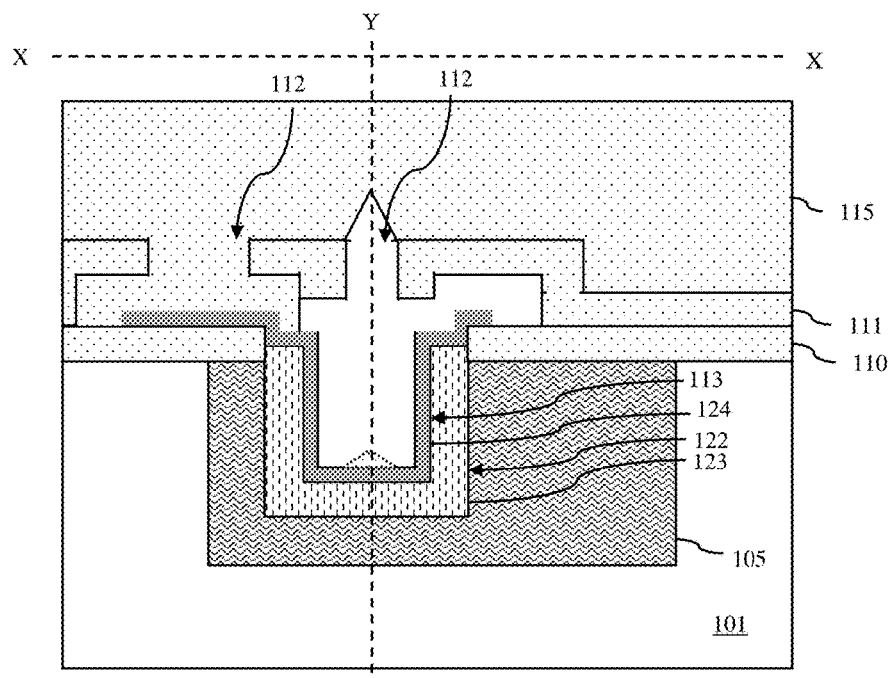
FIGS. 14A and 14B are different cross-section diagrams illustrating a partially completed semiconductor structure formed according to the flow diagram of FIG. 3.
Figure 14B:
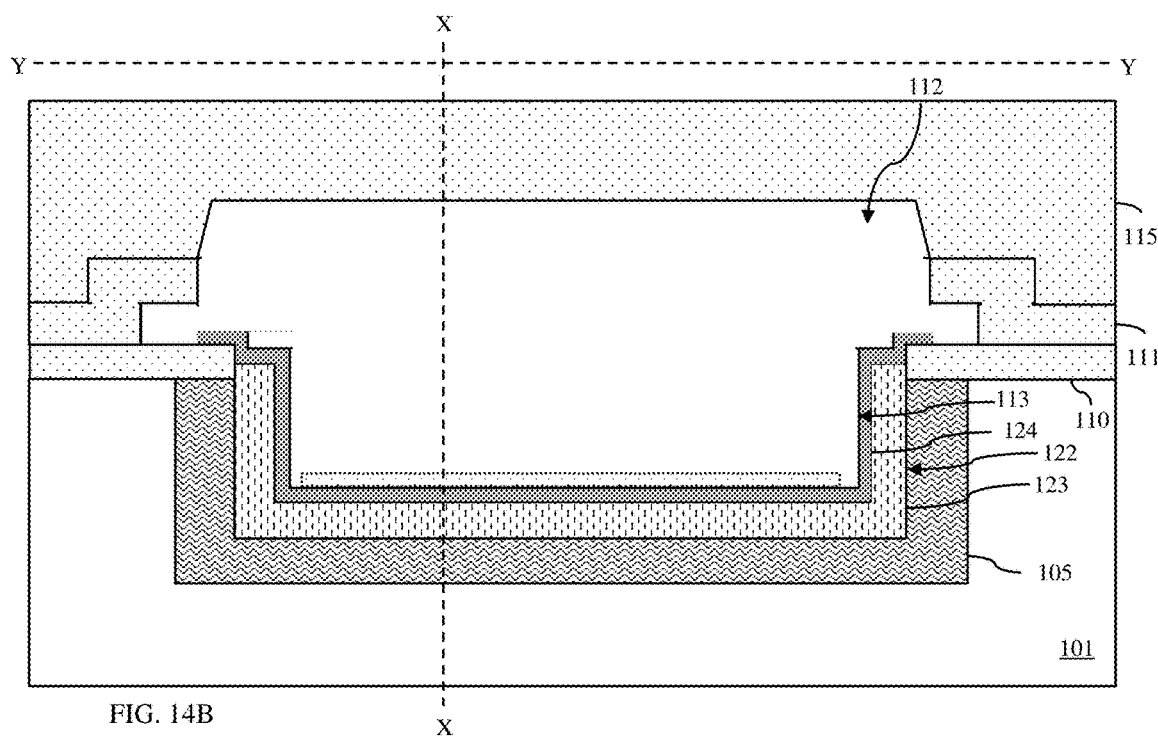

Following formation of the cavity 113, one or more interlayer dielectric (ILD) material layers can be formed (e.g., deposited or otherwise formed) on the second dielectric layer 111 (see process 324 and FIGS. 14A-14B). The ILD material layer 115 can be, for example, silicon dioxide or any other suitable ILD material. Depending upon the size of each opening 112 formed at process 320, the ILD material layer 115 may completely fill in the opening 112 and the portion of the cavity 113 below (e.g., see the relatively large opening 112 on the left-side of the FIG. 14A). However, in the case of relatively small openings 112 (e.g., see the relatively small opening 112 aligned above the trench 122 in FIG. 14A), the ILD material layer 115 just caps the opening(s) without filling them in. As illustrated, the bottom surface(s) of the portion(s) of the ILD material layer 115 that cap the opening(s) 112 may have concave surface(s) (e.g., with V or deep-V shape(s) extending into the ILD material layer 115). Additionally, some ILD material may be deposited through the opening(s) 112 in the cavity 113 (e.g., on portion(s) of the second semiconductor layer 124 aligned below the opening(s) 112). The top surface of the ILD material can then be planarized (e.g., using a conventional chemical mechanical polishing (CMP) process).

Figure 15A:
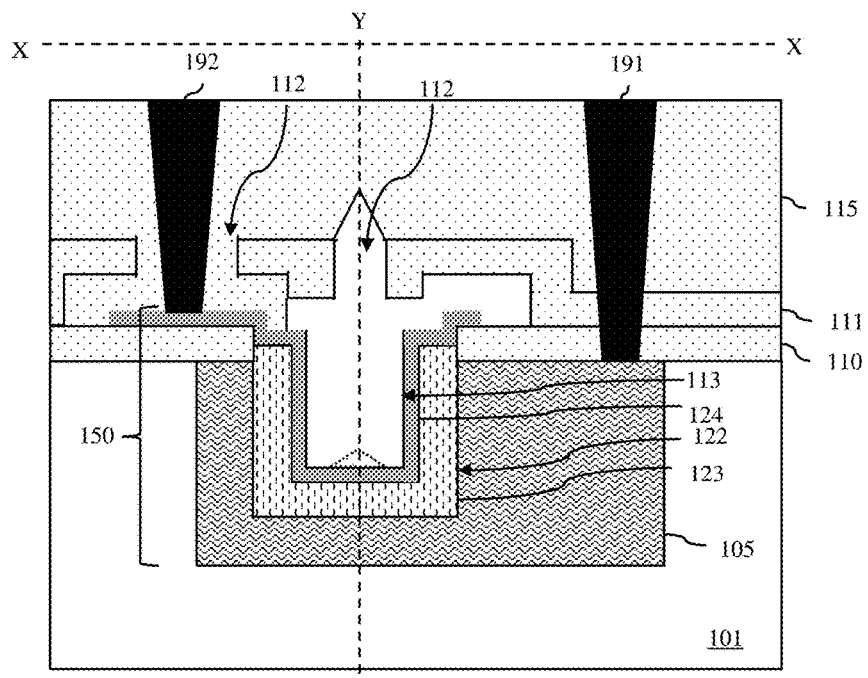
FIGS. 15A and 15B are different cross-section diagrams of an embodiment of a semiconductor structure formed according to the flow diagram of FIG. 3
Figure 15B:
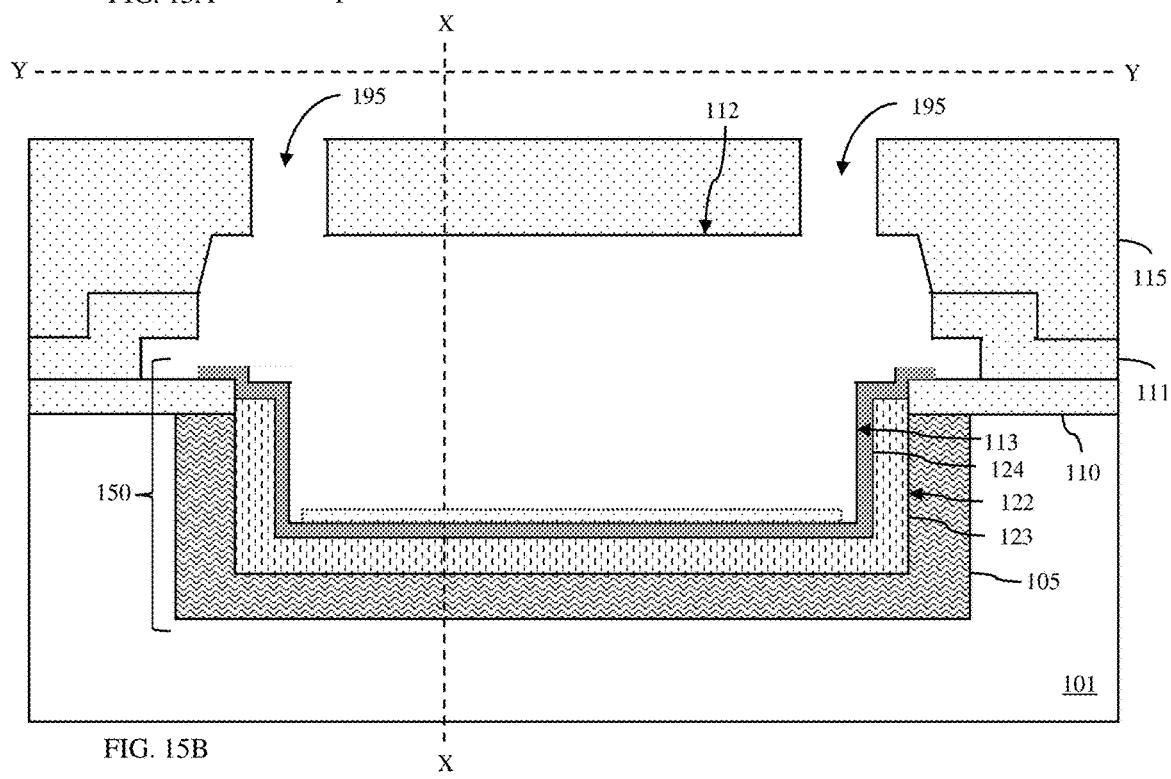
Figure 15C:
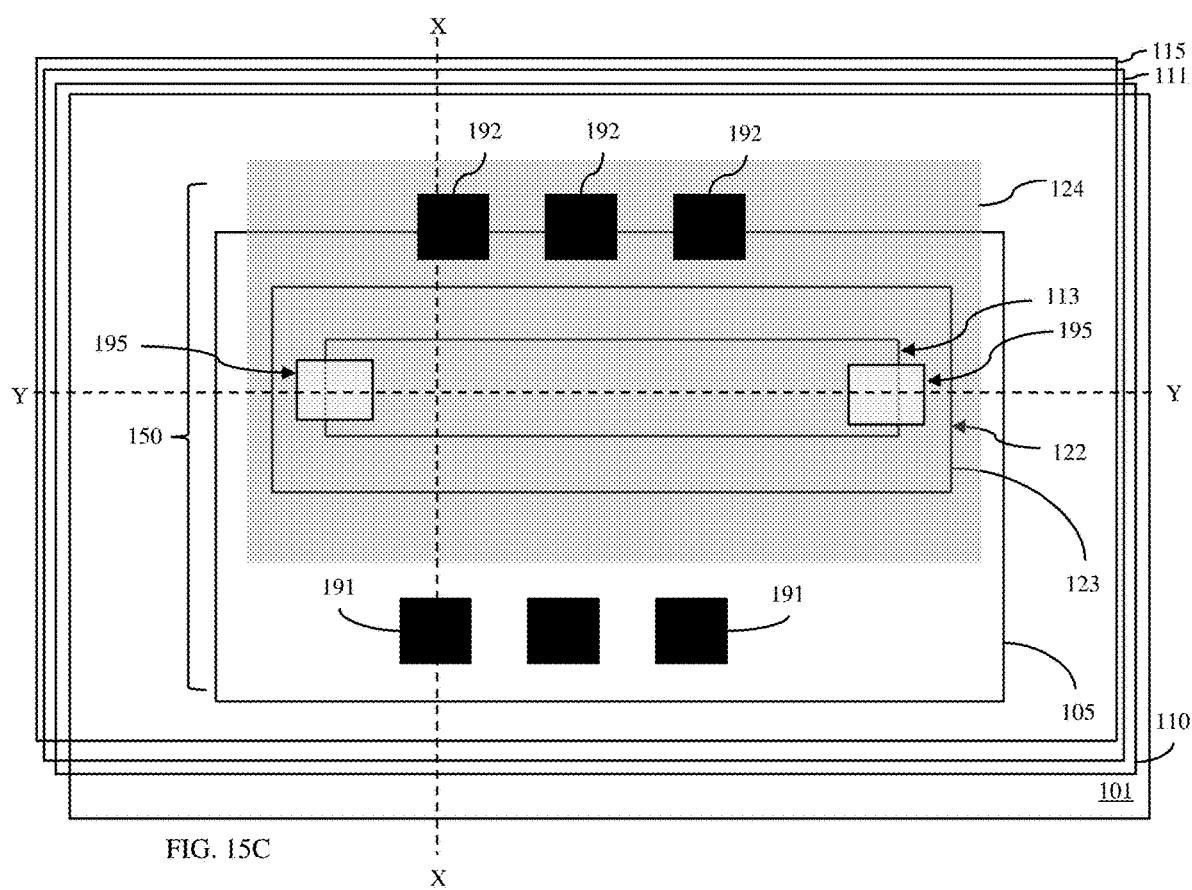
FIG. 15C is a layout diagram of the semiconductor structure shown in FIGS. 15A and 15B.

Additional processing can include, but is not limited to, the formation of at least one inlet/outlet port 195 and the formation of contacts 191-192, as described above (see process 326 and FIGS. 15A-15C). Techniques for forming such features are well known in the art and, thus, the details thereof have been omitted form this specification in order to allow the reader to focus on the salient aspects of the disclosed embodiments. Additional processing can also include performing a wet cleaning (e.g., using a diluted hydrofluoric acid (DHF) solution) to remove oxide material from the cavity 113 (e.g., oxide material deposited into the cavity 113 at process 324).

It should be understood that in the structures and methods described above, a semiconductor material refers to a material whose conducting properties can be altered by doping with an impurity. Exemplary semiconductor materials include, for example, silicon or germanium-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon or germanium-based semiconductor material (e.g., silicon, silicon germanium, silicon germanium carbide, silicon carbide, etc.) is typically doped with a Group III dopant, such as boron (B) or indium (In), to achieve P-type conductivity, whereas such a semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/ or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first dielectric layer on a semiconductor substrate;
a well region in the semiconductor substrate adjacent to the first dielectric layer, wherein the well region has a first-type conductivity and wherein a trench extends through the first dielectric layer into the well region;
semiconductor layers lining the trench and comprising: a first semiconductor layer within the trench; and a second semiconductor layer having a first portion on the first semiconductor layer within the trench and a second portion extending laterally out of the trench onto the first dielectric layer, wherein the second semiconductor layer has a second-type conductivity that is different from the first-type conductivity; and
a second dielectric layer on the first dielectric layer and extending over a cavity at least partially within the trench, wherein surfaces of the first portion of the second semiconductor layer are exposed within the cavity.

2. The structure of claim 1, wherein the first semiconductor layer comprises an intrinsic semiconductor layer.

3. The structure of claim 1, further comprising:
at least one interlayer dielectric material layer on the second dielectric layer; and
at least one port extending from a top surface of the at least one interlayer dielectric material layer to the cavity, wherein the at least one port is configured to allow fluid to flow through the cavity and contact the surfaces of the first portion of the second semiconductor layer exposed within the cavity.

4. The structure of claim 1, further comprising:
at least one interlayer dielectric material layer on the second dielectric layer;
at least one first contact extending from a top surface of the at least one interlayer dielectric material layer to the well region on a first side of the trench; and
at least one second contact extending from the top surface of the at least one interlayer dielectric material layer to the second portion of the second semiconductor layer on a second side of the trench opposite the first side.

5. The structure of claim 1, wherein, adjacent to the well region, the semiconductor substrate has the second-type conductivity at a lower conductivity level than the second semiconductor layer.

6. The structure of claim 1, wherein the first-type conductivity is N-type conductivity and the second-type conductivity is P-type conductivity.

7. The structure of claim 1, wherein the semiconductor substrate is monocrystalline, the first semiconductor layer is monocrystalline, the first portion of the second semiconductor layer is monocrystalline, and the second portion of the second semiconductor layer is polycrystalline.

8. The structure of claim 1, wherein the second semiconductor layer comprises a different semiconductor material than the first semiconductor layer.

9. The structure of claim 1, wherein the second semiconductor layer comprises a same semiconductor material as than the first semiconductor layer.

10. The structure of claim 1, wherein the first semiconductor layer comprise a multi-layered structure comprising a quantum well region.

11. A method comprises:
causing a fluid to flow into a cavity in a semiconductor structure and adjacent to a photodiode, wherein the semiconductor structure comprises:
a first dielectric layer on a semiconductor substrate;
a well region in the semiconductor substrate adjacent to the first dielectric layer, wherein the well region has a first-type conductivity and wherein a trench extends through the first dielectric layer into the well region;
semiconductor layers lining the trench and comprising:
a first semiconductor layer within the trench; and a second semiconductor layer having a first portion on the first semiconductor layer within the trench and a second portion extending laterally out of the trench onto the first dielectric layer, wherein the second semiconductor layer has a second-type conductivity that is different from the first-type conductivity and wherein the photodiode comprises the well region, the first semiconductor layer and the second semiconductor layer; and a second dielectric layer on the first dielectric layer and extending over the cavity, wherein the cavity is at least partially within the trench, wherein surfaces of the first portion of the second semiconductor layer are exposed within the cavity, and wherein the fluid flowing into the cavity contacts the surfaces;

causing the photodiode to be illuminated, wherein the causing of the fluid to flow into the cavity and the causing of the photodiode to be illuminated are performed concurrently; and sensing an output current of the photodiode in response to concurrent illumination of the photodiode and fluid flow into the cavity.

12. A method comprising:

providing a semiconductor substrate; and forming a semiconductor structure comprising:
- a first dielectric layer on the semiconductor substrate;
- a well region in the semiconductor substrate adjacent to the first dielectric layer, wherein the well region has a first-type conductivity and wherein a trench extends through the first dielectric layer into the well region;
- semiconductor layers lining the trench and comprising: a first semiconductor layer within the trench; and a second semiconductor layer having a first portion on the first semiconductor layer within the trench and a second portion extending laterally out of the trench onto the first dielectric layer, wherein the second semiconductor layer has a second-type conductivity that is different from the first-type conductivity; and
- a second dielectric layer on the first dielectric layer and extending over a cavity at least partially within the trench, wherein surfaces of the first portion of the second semiconductor layer are exposed within the cavity.

13. The method of claim 12, wherein the forming of the semiconductor structure comprises:

forming the well region in the semiconductor substrate;

forming the first dielectric layer on the semiconductor substrate over the well region;

forming the trench through the first dielectric layer into the well region;

lining the trench with the first semiconductor layer, wherein the first semiconductor layer comprises an intrinsic semiconductor layer;

forming the second semiconductor layer;

forming an additional material layer on the second semiconductor layer, wherein the additional material layer fills all remaining space within the trench and further extends over the second portion of the second semiconductor layer and onto the first dielectric layer;

forming the second dielectric layer on the first dielectric layer and further extending over the additional material layer;

forming openings that extend through the second dielectric layer to the additional material layer; and selectively removing the additional material layer to form the cavity.

14. The method of claim 13, wherein the first semiconductor layer and the additional material layer comprise a first semiconductor material and the second semiconductor layer comprises a second semiconductor material that is different from the first semiconductor material.

15. The method of claim 13, wherein the first semiconductor layer and the additional material layer comprise germanium and the second semiconductor layer comprises silicon.

16. The method of claim 13, wherein the additional material layer and the second semiconductor layer comprise different semiconductor materials and wherein the second semiconductor layer and the first semiconductor layer comprise any of a same semiconductor material and different semiconductor materials.

17. The method of claim 13,
wherein the semiconductor substrate is monocrystalline,
wherein the lining of the trench with the first semiconductor layer comprises selectively epitaxially growing the first semiconductor layer such that the first semiconductor layer is monocrystalline, and
wherein the forming of the second semiconductor layer comprises non-selectively epitaxially growing the second semiconductor layer such that the first portion of the second semiconductor layer is monocrystalline and the second portion of the second semiconductor layer is polycrystalline.

18. The method of claim 13, wherein the lining of the trench with the first semiconductor layer comprises forming a multi-layered structure comprising a quantum well region.

19. The method of claim 12, further comprising:
forming at least one interlayer dielectric material layer on the second dielectric layer; and
forming at least one port extending from a top surface of the at least one interlayer dielectric material layer to the cavity.

20. The method of claim 12, further comprising:
forming at least one interlayer dielectric material layer on the second dielectric layer; and
forming contacts comprising:
at least one first contact extending from a top surface of the at least one interlayer dielectric material layer to the well region on a first side of the trench; and
at least one second contact extending from the top surface of the at least one interlayer dielectric material layer to the second portion of the second semiconductor layer on a second side of the trench opposite the first side.

* * * * *